United States Patent [19]
Ito et al.

[11] Patent Number: 5,561,326
[45] Date of Patent: Oct. 1, 1996

[54] LARGE SCALE INTEGRATED CIRCUIT DEVICE

[75] Inventors: Hiroki Ito; Hisao Yoshida; Teruo Ina, all of Amagasaki, Japan

[73] Assignee: Mitsubishi Denki Kabushiki Kaisha, Tokyo, Japan

[21] Appl. No.: 414,014

[22] Filed: Mar. 30, 1995

Related U.S. Application Data

[62] Division of Ser. No. 2,464, Jan. 7, 1993.

[30] Foreign Application Priority Data

| Jan. 8, 1992 | [JP] | Japan | 4-001498 |
| Jan. 14, 1992 | [JP] | Japan | 4-004636 |
| Mar. 18, 1992 | [JP] | Japan | 4-060858 |
| Jun. 9, 1992 | [JP] | Japan | 4-149419 |
| Jun. 24, 1992 | [JP] | Japan | 4-166010 |
| Nov. 18, 1992 | [JP] | Japan | 4-308599 |

[51] Int. Cl.$^6$ .................................................. H01L 23/48
[52] U.S. Cl. ........................... 257/751; 257/753; 257/915
[58] Field of Search .......................... 257/751, 753, 257/915

[56] References Cited

U.S. PATENT DOCUMENTS

| 4,088,926 | 5/1978 | Fletcher et al. | 315/111.2 |
| 4,098,919 | 7/1978 | Morimoto et al. | 427/42 |
| 4,394,210 | 7/1983 | Morimoto et al. | 156/608 |
| 4,622,236 | 11/1986 | Morimoto et al. | 427/38 |

(List continued on next page.)

FOREIGN PATENT DOCUMENTS

| 0269019 | 6/1988 | European Pat. Off. . |
| 0430403 | 6/1991 | European Pat. Off. . |
| 0488576 | 6/1992 | European Pat. Off. . |

(List continued on next page.)

OTHER PUBLICATIONS

Ito et al, "Dual Ion Beam Deposition Of Oxide, Nitride, And Carbide Films",*Journal of Vacuum Science & Technology*, vol. B7, No. 6, Nov. 1989, pp. 1963–1966.

Jimenez et al, "Silicon Reaction Of TiN$_x$ Diffusion Barriers At High Temperatures", *Journal of Vacuum Science & Technology, vol. B9, No. 3, May 1991, pp. 1492–1496*.

Ito et al, "Development Of Ionized Cluster Beam Source For Practical Use", Rev. Sci. Instrum. 61 (1), 1990, pp. 604–606.

*Primary Examiner*—J. Carroll
*Attorney, Agent, or Firm*—Leydig, Voit & Mayer

[57] ABSTRACT

An integrated circuit device includes a barrier layer as an underlying layer for a wiring conductor layer. The barrier layer is formed of titanium oxide-titanium nitride or titanium nitride or composite layers of titanium, 2-titanium nitride and titanium nitride. The barrier layer may contain oxygen or carbon. A method of manufacturing an integrated circuit device includes steps of introducing a gas to the vicinity of a substrate disposed within a vacuum chamber, and forming a titanium oxide-titanium nitride thin film or titanium nitride film or the composite film by depositing titanium in vapor phase by using a cluster-type ion source while irradiating the substrate with nitrogen ions. A thin film forming apparatus comprises a cluster type ion source and a gas ion source. The cluster type ion source includes a vacuum chamber maintained at a predetermined vacuum level, a substrate disposed within the vacuum chamber, a gas introducing pipe for introducing gas to the vicinity of the substrate, a vapor generating source for ejecting a vapor of a material for deposition toward the substrate and producing vapor or cluster of the material, an ionizing electrode for ionizing a part of the vapor or clusters, and an accelerating electrode for controllably accelerating the ionized vapors or ionized clusters to thereby transport them to the substrate together with vapors or clusters of the material which are not ionized. The gas ion source includes a nitrogen gas introducing pipe disposed within the vacuum chamber, a gas ionizing electrode for ionizing a nitrogen gas, and an accelerating electrode for controllably accelerating nitrogen ions resulting from ionization by the gas ionizing electrode. Fine contact holes having a high aspect ratio can satisfactorily be coated with a wiring conductor film.

7 Claims, 23 Drawing Sheets

U.S. PATENT DOCUMENTS

| | | | |
|---|---|---|---|
| 4,710,283 | 12/1987 | Singh et al. | 204/298 |
| 4,783,248 | 11/1988 | Kohlhase et al. | 427/192 |
| 4,882,023 | 11/1989 | Wendman | 204/192.31 |
| 4,887,146 | 12/1989 | Hinode | 257/751 |
| 4,890,575 | 1/1990 | Ito et al. | 118/723 |
| 4,944,961 | 7/1990 | Lu et al. | |
| 4,977,440 | 12/1990 | Stevens | 257/753 |
| 5,108,846 | 4/1992 | Steininger | 428/694 |
| 5,196,102 | 4/1993 | Kumar | 427/528 |
| 5,202,579 | 4/1993 | Fujii et al. | 257/752 |
| 5,223,081 | 6/1993 | Doan | 156/628 |
| 5,243,213 | 9/1993 | Miyazawa et al. | 257/350 |
| 5,249,672 | 9/1992 | Lifshitz et al. | 437/189 |
| 5,278,911 | 1/1993 | Gordon et al. | 427/255.2 |
| 5,290,732 | 3/1994 | Kumar et al. | 437/183 |

FOREIGN PATENT DOCUMENTS

| | | | |
|---|---|---|---|
| 59-168635 | 9/1984 | Japan . | |
| 2-67763 | 3/1990 | Japan | 257/915 |
| 3-192768 | 8/1991 | Japan | 257/915 |
| WO86/01640 | 3/1986 | WIPO . | |

5,561,326

LARGE SCALE INTEGRATED CIRCUIT DEVICE

This disclosure is a division of application Ser. No. 08/002,464, filed Jan. 7, 1993.

BACKGROUND OF THE INVENTION

1. Field of the Invention

The present invention relates to a large scale integrated circuit (LSI) device having a barrier layer interposed between a wiring conductor layer and a substrate and a method and an apparatus used for manufacturing such an LSI device.

2. Description of the Related Art

In the large scale integrated circuit or LSI devices known heretofore, there is provided at an interface between a wiring conductor layer and an insulation layer a barrier layer formed of titanium nitride or the like with a view to preventing a material of the wiring conductor layer from being diffused into the insulation layer and at the same time for ensuring a positive adhesion between the wiring conductor layer and the insulation layer. As the LSI device tends to be implemented with a higher integration density in a finer structure or configuration, thickness of the individual layers or films constituting the LSI device decreases more and more, resulting in that the quality of a layer of film is more susceptible to the influence of an underlying layer or film. Under the circumstances, there exists a demand for disposition of the barrier layer of a high quality.

Besides, in accompanying an increase in the integration density of the LSI device, the design rule therefor (such as a width of the wiring conductor layer) becomes fine. For example, in the case of a 16 M-bit DRAM (Dynamic Random Access Memory), the rule for the conductor width or the like is less than half a micron. Further, contact holes formed along an aluminum wiring film or layer are each of 0.5 μm in diameter with an aspect ratio greater than "2" in the case of a 64 M-bit DRAM, while in the case of a 256 M-bit DRAM, the diameter of the contact hole is 0.3 μm with the aspect ratio being on the order of "5". Besides, in the case of a 1 G-bit DRAM which is expected to be developed in the not far distant future, more severe dimensional tolerances or requirements will be imposed in respect to the diameter and the aspect ratio of the contact holes. As a consequence, a higher reliability has to be realized for suppressing breakage due to a migration phenomenon. In this connection, it is noted that even in the present state of the art, difficulty is encountered in burying a wiring conductor layer within the contact hole in succession to formation of a barrier layer through evaporation or vapor deposition process, making it difficult to form a metal wiring layer smoothly in a facilitated manner.

For a better understanding of the present invention, the related art will be discussed in some detail.

FIG. 27 shows in an enlarged view an integrated circuit known heretofore. Reference may be made to "NIKKEI MICRODEVICE", (February 1991). More specifically, a multi-layer wiring section of a 64 M-bit DRAM of simple stack type cell structure is shown in a fragmental enlarged view. Referring to the figure, the integrated circuit includes a second metal wiring layer 1 formed of an alloy of aluminum, silicon and copper and/or the like, a second inter-layer insulation layer 2 of silicon dioxide, a second inter-layer interconnection plug 3, a second barrier layer 4 of titanium nitride, a first metal wiring layer 5 of aluminum, silicon or an alloy thereof, a first inter-layer insulation layer of silicon dioxide, a first inter-layer interconnection plug 7, a first barrier layer 8 of titanium nitride and a silicon substrate 9.

FIG. 28 shows in an enlarged sectional view an integrated circuit structure known heretofore. More specifically, a wiring contact hole of a 64 M-bit DRAM of a simple stack type cell structure and a layer structure thereof are shown. Referring to the figure, this known integrated circuit device is composed of a metal wiring layer 1A formed of an alloy of aluminum, silicon and copper, a barrier layer 2A of titanium nitride, a silicon substrate 3A and a contact hole 4A.

In the integrated circuit devices mentioned above, compound thin films such as of silicon dioxide ($SiO_2$), alumina ($Al_2O_3$), titanium nitride ($TiN_x$) are deposited through a vacuum evaporation process, a sputtering process or a CVD (Chemical Vapor Deposition) process. However, the compound thin films deposited through the processes mentioned above suffer not a few shortcomings such as significant variance in the characteristics, inappropriateness in composition, feeble adherence and others. Besides, limitation is encountered in coating of such portions as contact holes, through-holes or the like with a layer of a uniform thickness.

FIG. 29 is a diagram showing schematically a general structure of a magnetron type sputtering apparatus which is disclosed in "Journal of Vacuum Science and Technology A", Vol. 3, No. 2, (1985). Referring to the figure, a reference numeral 25 denotes a vacuum sputtering chamber within which a sputter processing is carried out. Disposed within the vacuum chamber 25 in opposition to substrates 20 is a target 21 made of titanium and disposed on a target holder 24 in which magnets are accommodated. A shutter 22 is interposed between the substrates 20 and the titanium target 21. An inactive gas such as argon or the like is introduced into the sputtering chamber 25 through an appropriate gas supply system 23. A reference numeral 26 denotes an evacuation system for evacuating the chamber 25.

Operation of the magnetron type sputtering apparatus of the structure shown in FIG. 29 will be described below. First, the sputtering chamber 25 is evacuated through the evacuating system 26. Subsequently, nitrogen and argon gases are introduced into the chamber 25 through the gas supply system 23. Next, a bias voltage is applied to the substrates 20 with a positive polarity relative to the target 21 for the purpose of coating the substrate 20 with a barrier film for a wiring conductor layer. In this state, plasma is generated between the target 21 and the substrate 20.

At that time, electrons within the plasma are caused to rotate spirally under the magnetic forces of the magnets accommodated within the target holder 24, whereby plasma generation is much promoted.

On the other hand, argon ions in the plasma are caused to impinge on the target 21 under acceleration by the bias voltage to thereby sputter the target material or titanium. By opening the shutter 22, titanium atoms as sputtered are deposited over the substrate 20 at the presence of a nitrogen gas atmosphere to form a titanium nitride barrier film for the wiring conductors.

FIG. 30 is a sectional view showing a contact hole having an aspect ratio of about 0.8 in the state deposited with a film by using a magnetron type sputtering apparatus, which is reported in "A Collection of Preliminaries for Semicon Japan 88 Technical Symposium".

In FIG. 30, a substrate 20 is formed with contact holes 31 each having a diameter of 0.5 micron and a depth of 2.0 microns. A wiring conductor film 32 of aluminum is formed over the substrate 20 inclusive of the contact hole 31, wherein a nitride titanium barrier film 33 is formed underneath the aluminum film 32.

As can be seen in FIG. 30, the thickness of the barrier film 33 is decreased at a lower side wall portion and a bottom of the contact hole 31 as compared with that of the barrier film portion deposited at other flat portions due to growth of an overhang and a self shadowing effect taking place spontaneously in the course of processing.

In this manner, when the aluminum wiring conductor film 32 is formed over the barrier film 33 by the magnetron type sputtering process, an overhang portion is inevitably formed, resulting in reduction in the overall film thickness at the bottom of the contact hole.

As is appreciated from the above description, it is difficult to form a film in a uniform thickness over the whole surface of a contact hole having a high aspect ratio typified by a diameter of 0.5 µm and a depth of 2.0 µm by the wiring conductor layer formation technique which relies on the magnetron type sputtering process.

At this juncture, it is noted that in the magnetron type sputtering apparatus known heretofore, sputtered particles collide against active particles of plasma to be thereby scattered. Consequently, the particles sputtered from the target have a short mean free path on the order of several centimeters.

As will now be understood from the above, the magnetron type sputtering process suffers from a problem that probability of the sputtered particles reaching the bottom of a contact hole having an aspect ratio of a value greater than "2" is remarkably decreased, making it impossible to form a wiring conductor film or layer on offset portions such as the side wall and the bottom of the contact hole.

As the measures for coping with the problem described above, there has been developed a cluster ion beam vapor deposition apparatus in which a point-like or spot-like evaporation source is used. FIG. 31 is a schematic diagram showing as a typical one of such cluster ion beam vapor deposition apparatus a reaction type cluster ion beam (R-ICB) apparatus which is capable of forming a thin film of a relatively high quality and which is disclosed in "Proceedings of the Seventh Symposium on Ion Source and Ion Assisted Technology". Referring to FIG. 31, a vacuum or reaction chamber 41 is held at a predetermined vacuum level through an evacuation system 42 and is equipped with a reactive gas introducing system 43 which is comprised of a gas bomb filled with a reactive gas such as oxygen gas, a flow regulating valve 45 for regulating a flow of reactive gas introduced to the vacuum chamber 41 and a reactive gas introducing pipe 46.

A vapor generation source generally denoted by a numeral 50 includes a closed type crucible having a nozzle 51 and filled with a material for evaporation, a filament 53 for heating the crucible 52 and a heat shielding enclosure 54. A cluster (i.e., aggregation of atoms) 66 is formed by ejecting vapor of the material 55 for evaporation from the crucible 52 through the nozzle 51.

An ionizing means 60 for ionizing the cluster 56 is composed of an electron beam emission filament 61, an electron drawing electrode 62 for drawing and accelerating electrons emitted from the filament 61 and a heat shielding plate 63. The ionized clusters 66 are caused to collide against a substrate 67 under the acceleration effect of an electric field generated by an accelerating electrode 65. The substrate 67 has a surface formed with a thin film of oxide and is adapted to be rotated by a rotating means 69 such as an electric motor through a rotatable shaft 68. A power supply system 80 includes DC power supply sources 81, 82 and 83 for supplying DC bias voltages and power supplies 84 and 85 for supplying currents for heating the filaments 53 and 62, respectively.

The individual bias voltage sources included in the power supply system 80 serve for such functions as described below. The first DC power supply 81 is used for biasing the crucible or pot 52 with a positive potential relative to the filament 53 so that thermal electrons emitted from the crucible heating filament 53 electrically energized by the filament heat power supply 84 collide against the crucible 52. The second DC power supply 82 is used for biasing the electron drawing electrode 62 with a positive potential relative to the filament 61 so that the thermal electrons emitted from the ionizing filament 61 heated by the filament heating power supply source 85 are drawn internally of the electrode 62. Further, the third DC power supply 83 serves to bias the electron beam drawing electrode 62 and the crucible 52 with a positive potential relative to the accelerating electrode 65 which is at the ground potential, as a result of which an electric field is formed for accelerating the cluster ions carrying positive electric charge.

Next, description will be directed to operation of the cluster ion beam evaporation apparatus.

After evacuation of the vacuum chamber 41 by means of the evacuating system 42 so that vacuum lower than $10^{-4}$ Torr prevails within the chamber 41, the flow regulating valve 45 is opened to allow a reactive gas to be supplied into the chamber 41 through the gas introducing pipe 46.

On the other hand, electrons emitted from the crucible heating filament under the effect of the electric field applied by the DC power supply 81 are caused to collide against the crucible 52 to thereby heat it until the vapor pressure within the crucible 52 has attained a level of several Torrs. Then, the evaporation material 55 within the crucible is vaporized and ejected into the vacuum space through the nozzle 51. The ejected vapor undergoes adiabatic expansion in the course of flowing through the nozzle 51 to be thereby accelerated and at the same time condensed to thereby form aggregation of atoms or atom cloud referred to as the clusters 66. The clusters 66 are then partially ionized by electrons emitted from the ionizing filament 61 to be partially transformed into cluster ions, which are further accelerated under the action of an electric field generated by the accelerating electrode 65 to collide against the substrate 67 which is rotated, together with neutral cluster not ionized. Existing in the vicinity of the substrate 67 is an oxygen gas having reactivity. Thus, reaction of the clusters of evaporation material 55 with the reactive gas takes place above and in the vicinity of the substrate 67, resulting in that a thin oxide film is deposited over the exposed surface of the substrate 67.

In general, the ionized clusters 66 ejected into the vacuum space has a long mean free path. Accordingly, probability of the clusters 66 ionized and accelerated to collide with other ionized clusters before reacting the substrate 67 is low. Thus, the clusters can arrive at the contact holes and through-holes formed in the substrate with an improved directivity.

In the cluster ion beam vapor deposition apparatus having the point-like evaporation source, as shown in FIG. 31, the kinetic energy of the ionized clusters 66 which irradiate the substrate 67 can be controlled optimally by controlling correspondingly the bias voltage applied to the accelerating electrode 65, while the amount of ions can be increased by increasing the number of electrons emitted from the ionizing filament 61, whereby the amount of clusters deposited on the bottom surface of the contact hole even of an extremely small aspect ratio can be increased. In this way, there can be formed a film of an adequate thickness over the bottom surface even of the contact hole having the small aspect ratio such as typified by a hole diameter in the range of 0.5 to 1 μm. However, the film deposited on the side wall of the contact hole of the small aspect ratio is thin when compared with the film formed over the bottom surface. In particular, the cluster ion beam evaporation apparatus is poor in the capability of forming a film of a desired thickness at offset portions. In this conjunction, it is to be noted that in a region where the wiring film is thin, migration of aluminum atoms takes place due to electric field concentration and/or stress concentration, incurring possibly breakage of wiring conductor.

Further, in the case where the point-like evaporation source is disposed beneath the substrate at a position coinciding with the axis of rotation of the substrate in the cluster ion beam vapor deposition apparatus, there arise problems mentioned below.

FIG. 32 is an exaggerated view of FIG. 31 and shows major portions of the cluster ion beam vapor deposition apparatus. In FIG. 32, bottom portions of the contact holes 67a which are located at positions closer to the rotation axis 68 are designated by a symbol "B" while the side wall and bottom portions located remotely from the rotation axis 68 are designated by a symbol "A". When the cluster ion beam point-like evaporation source is disposed immediately below the rotation axis 68, a satisfactory coating efficiency can be achieved at the portions A of the contact hole because the ionized clusters can easily arrive at these portions A. However, at the portions B of the contact holes, the coating and burying efficiency are degraded because of the so-called self shadowing effect.

Further, it is noted that in the above-mentioned apparatus, the reactive gas within the vacuum chamber is in the molecular state and exhibits a low activity and hence a low reaction efficiency is resulted. Consequently, a major part of the reactive gas will be discharged with the result that only an extremely small part of the reactive gas can play a role in the formation of a thin film, giving rise to a serious problem.

In an effort to solve the problem, there is proposed an approach for activating the reactive gas by excitation, dissociation and partial ionization to thereby enhance the reaction efficiency.

A compound thin film forming apparatus which is designed to serve for this end is disclosed in Japanese Patent Publication No. 11662/1988. As is shown in FIG. 33, the compound film forming apparatus known heretofore includes a gas ion source juxtaposed to an ICB (Ionized Cluster Beam) source. Parenthetically, the ICB source is of a same structure as that shown in FIG. 31. Accordingly, components thereof are designated by like reference symbols as those used in FIG. 31 and repeated description is omitted. The gas ion source 89 of the thin film forming apparatus shown in FIG. 33 includes a gas ejection nozzle 90, an electron beam emitting means 92 provided on a path of a reactive gas, an electron beam drawing electrode 91 for drawing the electron beam, an acceleration electrode 93 for accelerating the gas ions, and an inner enclosure 94 for closing substantially completely the gas ion source 89. The gas ejection nozzle 90 is connected to a gas bomb 96 through a gas conduit 95 in which a gas flow regulating valve 97 is mounted. A power supply system 100 for the gas ion source 89 includes a power supply source 101 for heating a filament which constitutes the electron beam emitting means 92, a DC power supply source 102 for biasing the electron beam drawing electrode 91 at a positive potential relative to the filament 92, and a DC power supply source 103 for biasing the electron beam drawing electrode at a positive potential relative to the accelerating electrode 93.

Operation of the compound thin film forming apparatus is performed as follows.

The vacuum chamber 41 held at a high vacuum level by the evacuating apparatus 42 is supplied with a reactive gas from the gas bomb 96 and introduced in the chamber 41 through the gas ejection nozzle 90 by adjusting the gas flow by means of the regulating valve 97 so that a gas pressure in a range of $10^{-4}$ to $10^{-3}$ Torr prevails within the vacuum chamber 41. At that time, the gas pressure within the inner enclosure 94 is held at a higher level. On the other hand, the filament 92 which functions as the electron beam emitting means is electrically heated by the heating power supply source 101, while the electron beam drawing electrode 91 disposed at a position down stream of the gas ejection nozzle 90 is applied with a bias voltage from the DC power supply source 102, whereby the reactive gas is excited, dissociated and partially ionized by the thermal electrons. Thus, the reactive gas assumes the activated state.

Subsequently, the crucible 52 is heated by the crucible heating filament 53 up to such a temperature that the vapor pressure within the crucible 52 becomes several Torrs. As a result of this, the evaporation material 55 is vaporized and ejected through the nozzle 51. The vaporized particles or clusters are partially ionized by electrons emitted from the ionizing filament 61 and accelerated under the effect of the electric field produced by the accelerating electrode 3 to be thereby forced to collide against the substrate 67 together with the vaporized particles or clusters not ionized.

On the other hand, there exists the reactive gas excited, dissociated or ionized in the vicinity of the substrate 67, and collision of the reactive gas with the vapor particles or clusters takes places to promote the reaction for depositing a chemical compound over the substrate 67 to thereby form a thin film on the substrate. When the bias voltages are applied to the accelerating electrodes 65 and 93 from the associated DC power supply sources, the aforementioned ions can arrive at the substrate 67 under acceleration. Thus, by varying the accelerating voltage, it becomes possible to control the kinetic energy of the vapor or clusters independently from that of the reactive gas ions impinging onto the substrate 67, whereby characteristics of the compound thin film formed on the substrate 67 such physical properties or quantities and structure (monocrystal, polycrystal, amorphous structure and others) can be controlled.

Although the thin film forming apparatus described just above can enjoy an improved reactivity when compared with that of the apparatus shown in FIG. 31, there arises a problem that difficulty is encountered in controlling the composition ratio of oxygen and nitrogen contained in a nitrogen oxide film upon formation thereof.

SUMMARY OF THE INVENTION

The present invention is made with a view to solve the problems of the hitherto known film forming apparatuses described above and contemplates as an object to provide an integrated circuit which includes a barrier layer of high quality for preventing interaction and diffusion between a wiring conductor layer and a substrate or an intimately or closely deposited layer (adhesion layer), a method of manufacturing such integrated circuit and a thin film forming apparatus therefor.

Another object of the present invention is to provide a thin film forming apparatus which is capable of depositing a nitride oxide barrier thin film of high quality over a surface of a substrate with a high efficiency while controlling composition ratio between oxygen and nitrogen in a manner as desired.

It is still another object of the present invention to provide an integrated circuit in which a wiring conductor layer can easily be formed by fluidizing a metal for the wiring conductor layer within contact holes and allowing the fluidized metal to smoothly flow into the contact holes regardless of a fine structure or patterning of the integrated circuit.

It is yet anther object of the invention to provide a thin film forming method and a thin film forming apparatus which are excellent in coating fine offset portions such as contact holes of high aspect ratio or the like.

A further object of the present invention is to provide a thin film forming apparatus which is capable of forming a film uniformly even on inner surfaces of fine or minute contact holes having a high aspect ratio.

In view of the above and other objects which will become more apparent as description proceeds, there is provided according to an aspect of the invention, an integrated circuit device which comprises a barrier layer as an underlying layer for a wiring conductor layer, wherein the barrier layer is formed of a titanium oxide-titanium nitride (TiON) thin film.

According to another aspect of the invention, there is provided a method of manufacturing an integrated circuit device which comprises the steps of introducing an oxygen gas to the vicinity of a substrate disposed within a vacuum chamber, and forming a titanium oxide-titanium nitride (TiON) thin film by depositing titanium in vapor phase by using a cluster-type ion source while irradiating the substrate with nitrogen ions.

According to yet another aspect of the invention, there is provided a thin film forming apparatus for an integrated circuit device which comprises a cluster type ion source and a gas ion source, wherein the cluster type ion source includes a vacuum chamber maintained at a predetermined vacuum level, a substrate disposed within the vacuum chamber, a gas introducing pipe for introducing an oxygen gas to the vicinity of the substrate, a vapor generating source for ejecting a vapor of a material for deposition toward the substrate and producing vapor or cluster of the material, ionizing means for ionizing a part of the vapor or cluster of the material for vapor deposition, and accelerating means for accelerating controllably the ionized vapor or ionized cluster to thereby transport the ionized vapor or ionized cluster to the substrate together with vapor or cluster of the material for vapor deposition which is not ionized, and wherein the gas ion source includes a nitrogen gas introducing pipe disposed within the vacuum chamber, gas ionizing means for ionizing a nitrogen gas, the gas ionizing means including an electron beam drawing electrode and electron beam emitting means disposed at a location to which the nitrogen gas is introduced, and accelerating means for accelerating controllably nitrogen ions resulting from ionization by the gas ionizing means.

According to still another aspect of the invention, there is provided an integrated circuit device which comprises a wiring conductor layer formed on a substrate with a barrier layer being interposed therebetween, wherein the barrier layer is constituted by a thin film of titanium nitride ($TiN_x$) whose composition varies in the direction toward the wiring conductor layer from the substrate.

According to a further aspect of the invention, there is provided a method of manufacturing an integrated circuit device having a wiring conductor layer formed on a substrate with a barrier layer being interposed therebetween which comprises the steps of introducing a nitrogen gas to the vicinity of the substrate disposed within a vacuum chamber, irradiating the substrate with titanium ions generated from a cluster-type titanium ion source to thereby deposit titanium on the substrate, and forming the barrier layer of a thin film of titanium nitride ($TiN_x$) whose composition (x) changes progressively by controlling correspondingly the amount of the nitrogen gas introduced to the vicinity of the substrate within the vacuum chamber.

According to a still further aspect of the invention, there is provided an integrated circuit device having a wiring conduct or layer formed on a substrate with a barrier layer being interposed therebetween, wherein the barrier layer is formed of titanium nitride containing oxygen and carbon.

According to a yet further aspect of the invention, there is provided an integrated circuit device which comprises a wiring conductor layer formed in a contact hole and/or a through-hole, a barrier layer formed as an underlying layer for the wiring conductor layer, and a buffer layer of a metal formed between the barrier layer and the wiring conductor layer, the metal being easy to form an alloy with a material of the wiring conductor layer.

According to still another aspect to the invention, there is provided an apparatus for forming a wiring conductor film on a semiconductor device which comprises a vacuum chamber within which a substrate is disposed, a vapor generating source disposed in opposition to the substrate, ionizing means disposed between the vapors generating source and the substrate for ionizing vapor generated by the vapor generating source, accelerating means for imparting kinetic energy to the vapor ionized by the ionizing means to thereby accelerate the ionized vapor in the form of a vapor beam toward the substrate, means for introducing a rare gas into the vacuum chamber, and gas pressure control means for controlling a gas pressure of the rare gas.

According to a further aspect of the invention, there is provided a film forming apparatus which comprises a spot vaporization source having a point-like region from which vapor or ions of a material for forming a film is ejected, and means for depositing the ejected material on a substrate to thereby form the film, wherein the spot vaporization source is disposed directly below an outer peripheral portion of the substrate or at a position radially externally of the outer peripheral portion, and means for revolving the spot vaporization source along a circular path having a center at an axis extending through a center of the substrate.

The above and other objects, attendant features and advantages of the present invention will become more apparent by reading the following description of preferred or exemplary embodiments taken with reference to the drawings.

BRIEF DESCRIPTION OF THE DRAWINGS

FIGS. 17(a) and 17(b) to FIGS. 26(a) and 26(b) show schematically in top plan views and side elevational views, respectively, arrangements of spot evaporation sources which can be adopted in the apparatus shown in FIG. 16;

DESCRIPTION OF THE PREFERRED EMBODIMENTS

Now, the present invention will be described in detail in conjunction with preferred or exemplary embodiments thereof by reference to the drawings.

Figure 1:
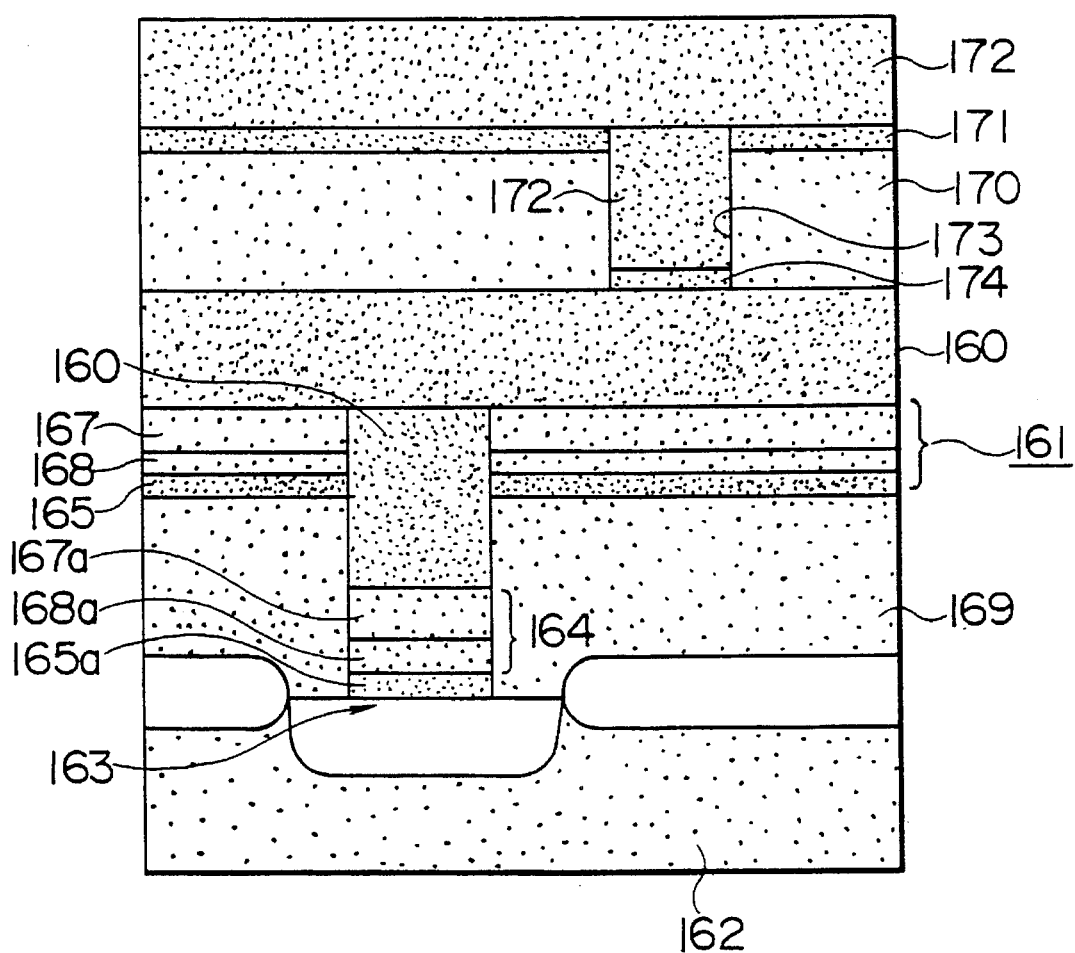
FIG. 1 is a sectional view having partially a large scale integrated (LSI) circuit having contact holes and through-holes and manufactured according to a first embodiment of the present invention.

FIG. 1 is a sectional view of a large scale integrated (LSI) circuit device having contact holes and through-holes according to a first embodiment of the present invention. The LSI circuit device is comprised of a silicon substrate 162 above which a first wiring conductor layer 160 is provided with a first insulation layer 169 and a first barrier layer 161 being interposed between the Si-substrate 162 and the first wiring conductor layer 160. Further provided above the first wiring conductor layer 160 is a second wiring conductor layer 172 through interposition of a second insulation layer 170 and a second barrier layer 171. A contact hole 163 is so formed as to extend through the first barrier layer 161 and the first insulation layer 169, wherein the first wiring conductor layer 160 is partially buried within the contact hole 163 with a third barrier layer 164 being formed therein. The first barrier layer 161 interposed between the first insulation layer 169 and the first wiring conductor layer 160 includes three sub-layers having respective compositions differing from one another. More specifically, the first barrier layer 161 comprises a titanium sub-layer 165 disposed adjacent to the first insulation layer 169, a titanium nitride sub-layer 167 formed adjacent to the first wiring conductor layer 160 and a 2-titanium nitride sub-layer 168 sandwiched between the titanium sub-layer 165 and the titanium nitride sub-layer 167. The third barrier layer 164 formed within the contact hole 163 is of a substantially same structure as the first barrier layer and includes a titanium sub-layer 165a formed adjacent to the silicon substrate 162, a titanium nitride sub-layer 167a formed adjacent to the first wiring conductor layer 160 and a 2-titanium nitride sub-layer 168a interposed between the titanium sub-layer 165a and the titanium nitride sub-layer 167a. A through-hole 172 is formed so as to extend through the second barrier layer 171 formed of titanium and the second insulation layer 170, wherein the through-hole 173 is partially filled with the second wiring conductor layer 172, and a barrier layer 174 of titanium is formed within the through-hole 173 between the second wiring conductor layer 172 and the first wiring conductor layer 160.

With the structure of the integrated circuit shown in FIG. 1, the quality of the electric contact as well as that of the barrier can advantageously be improved by changing appropriately the composition ratio of titanium and nitrogen of the barrier layers 161 and 164 even when these barrier layers are implemented in a thinner film structure.

Figure 2:
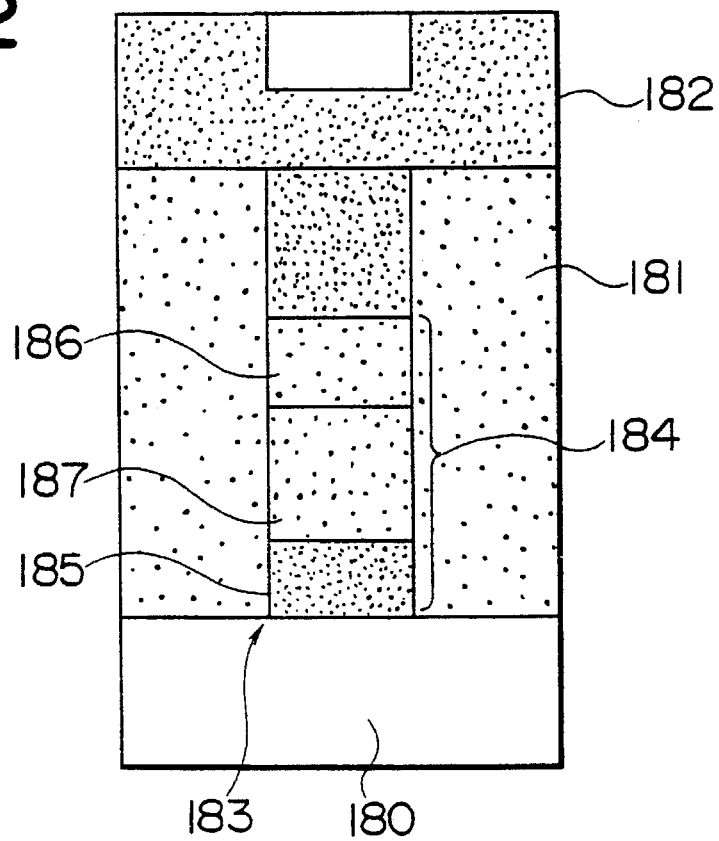
FIG. 2 is a sectional view of a large scale integrated circuit (LSI) incorporating a barrier layer according to another embodiment of the invention.
Figure 3:
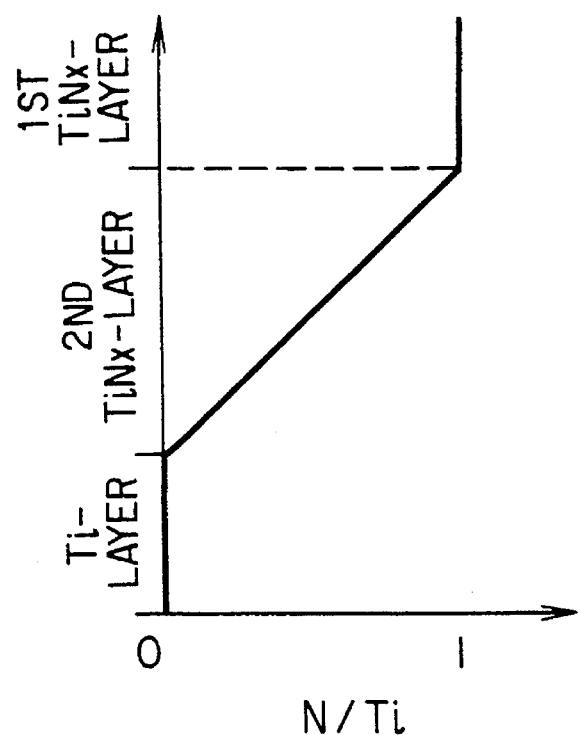
FIG. 3 shows variation in a nitrogen-titanium ratio in a titanium nitride layer formed according to an embodiment of the invention.

FIG. 2 is a sectional view of a large scale integrated circuit (LSI) incorporating a barrier layer according to another embodiment of the invention. In the case of the illustrated structure of the LSI device, a wiring conductor layer 182 is provided above a silicon substrate 180 with an insulation layer 181 being interposed therebetween. Formed within a contact hole 183 extending through the insulation layer 181 is a barrier layer 184 which is constituted by a titanium sub-layer 185 formed in contact with the silicon substrate 180, a first titanium nitride sub-layer having a substantially constant nitride/titanium composition profile and formed in contact with the wiring conductor layer 182 and a second titanium nitride ($TiN_x$) sub-layer 187 interposed between the titanium sub-layer 185 and the first titanium nitride sub-layer 186. In conjunction with the second titanium nitride sub-layer 187, it should be mentioned that nitrogen content thereof progressively increases in the direction toward the first titanium nitride sub-layer 186 from the titanium sub-layer 185. More specifically, in the case of the illustrated structure, the nitrogen-titanium ratio (i.e., N/Ti) in the second titanium nitride sub-layer 187 increases approximately in proportion to a distance from the titanium sub-layer 188, as is shown in FIG. 3.

Figure 31:
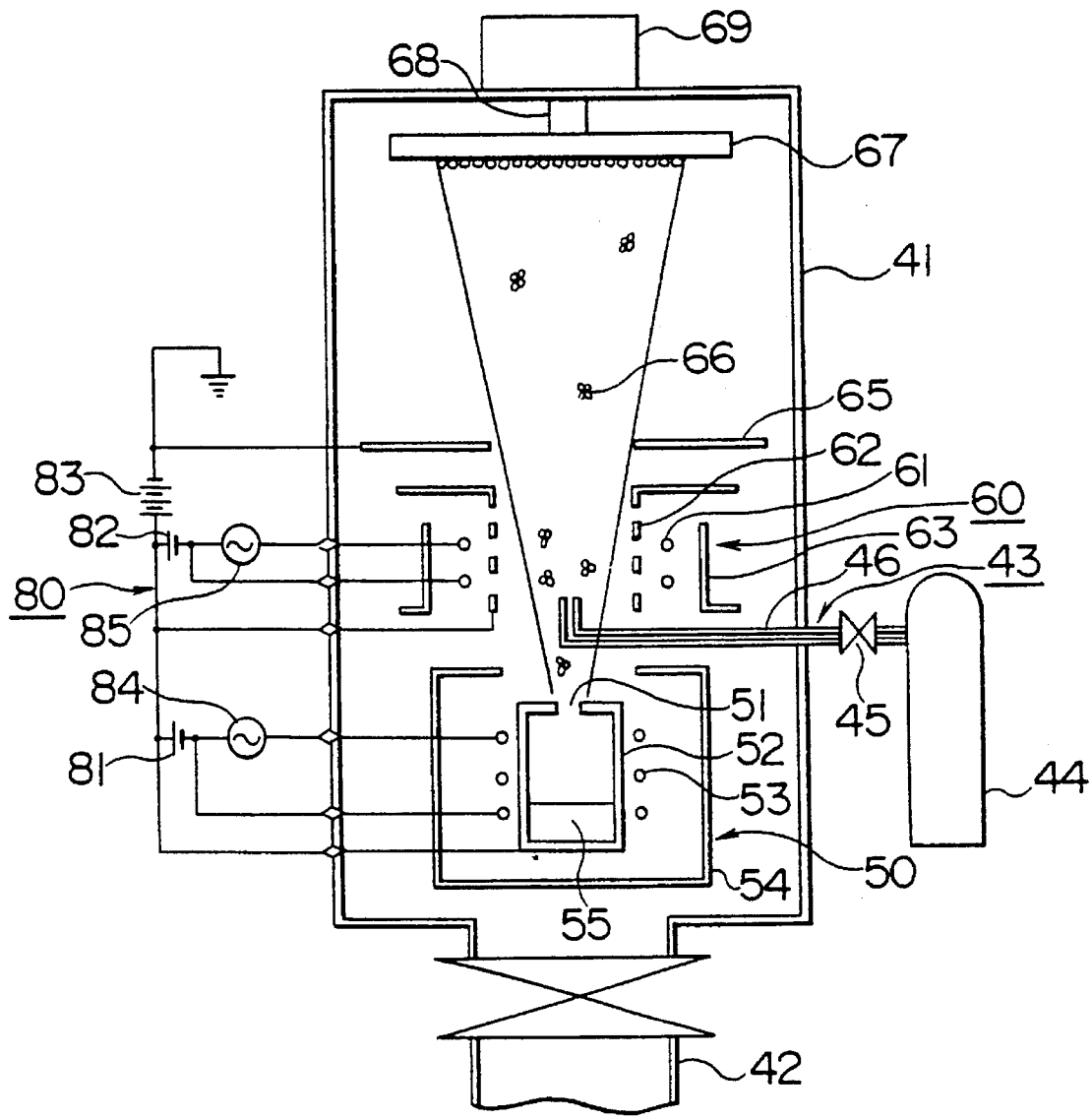
FIG. 31 is a schematic diagram showing a reaction type cluster ion beam apparatus known heretofore.

The large scale integrated circuit structures shown in FIGS. 1 and 2 can be manufactured by using a thin film forming apparatus shown in FIG. 31 in a manner described below. First, the vacuum chamber 41 is evaluated to a vacuum level of less than $10^{-4}$ Torr by means of the evacuating system 42. Thereafter, the flow regulating valve 45 is opened to introduce a nitrogen gas into the vacuum chamber 41 through the gas introducing pipe 46. On the other hand, the crucible 52 is heated up to a temperature corresponding to a vapor pressure of several Torrs within the crucible by electrically energizing the crucible heating filament from the DC power supply source 81 to thereby cause the emitted electron to collide against the crucible under the electric field applied by the DC power supply source 81, as a result of which titanium 55 contained in the crucible as a material to be deposited (i.e., material for evaporation or vapor deposition) is vaporized, whereby titanium vapor is ejected into the vacuum space through the nozzle 51. The titanium vapor is accelerated and condensed through adiabatic expansion upon passing through the nozzle 51, whereby atom clouds (i.e., aggregation of atoms) referred to as clusters 66 are formed. The clusters 66 are then partially ionized by electrons emitted from the ionization filament 61 to be transformed to cluster ions which are then accelerated under the action of the electric field generated by the acceleration electrode 65 to impinge on the substrate together with neutral clusters which are not ionized. On the other hand, a nitrogen gas exhibiting a reactivity is present in the vicinity of the substrate 67. Thus, as the result of the reaction between the clusters 66 of titanium 55 and the reactive gas, there is deposited a titanium nitride film on the substrate 67. In that case, composition of the titanium nitride layer can be varied by controlling the flow of nitrogen gas introduced through the gas pipe 46 by means of the flow regulating valve 45.

Figure 4:
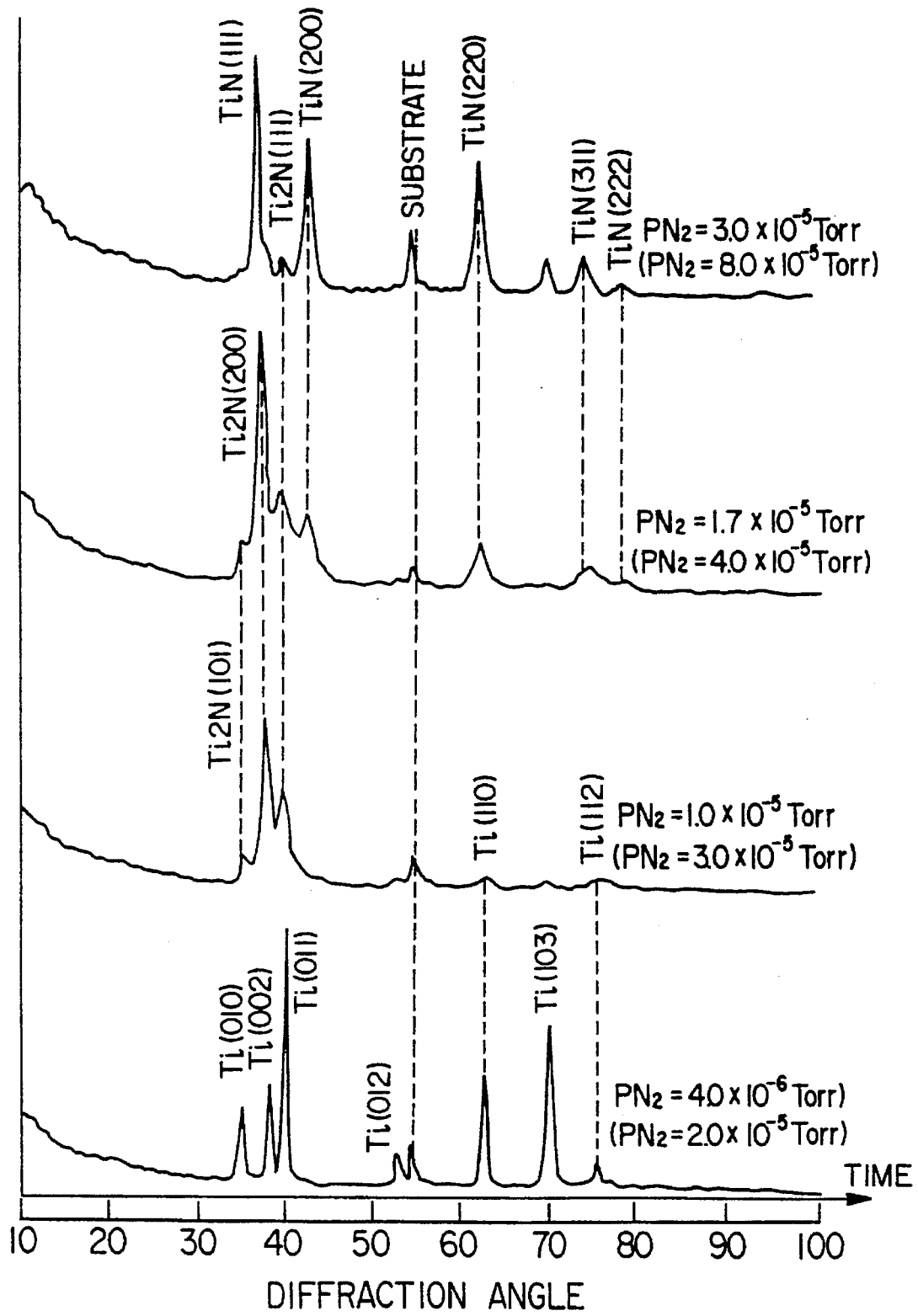
FIG. 4 is a diagram showing results of X-ray diffraction analyses of crystalline structures of titanium nitrides formed according to an embodiment of the invention.

FIG. 4 is a view showing results of X-ray diffraction analyses of crystalline structures of the titanium nitrides formed by varying the amount of the nitrogen gas flow introduced as described above. As can be seen from FIG. 4, at a nitrogen partial pressure lower than $4.0 \times 10^{-6}$ Torr, crystal structure of titanium (Ti) is formed. At a nitrogen partial pressure of $1.0 \times 10^{-5}$ Torr, crystal of 2-titanium nitride (Ti2N) is formed. At $1.7 \times 10^{-5}$ Torr, a mixed crystal structure of 2-titanium nitride (Ti2N) and titanium nitride (TiN) is obtained. Further, at a nitrogen partial pressure higher than $3.0 \times 10^{-5}$ Torr, a titanium nitride (TiN) film is realized. In this manner, composition or contents of nitrogen and titanium in the film as well as crystalline structure thereof can be controlled in an arbitrary manner by controlling the partial pressure of nitrogen. Parenthetically, values of $PN_2$ indicated in parentheses in FIG. 4 represent partial pressures of nitrogen within the vacuum chamber before vaporization of titanium 55 takes place.

In this way, by controlling the amount of nitrogen gas introduced in the vacuum chamber 41, the composition ratio between titanium and nitrogen in the titanium nitride layer can easily be changed.

Figure 5:
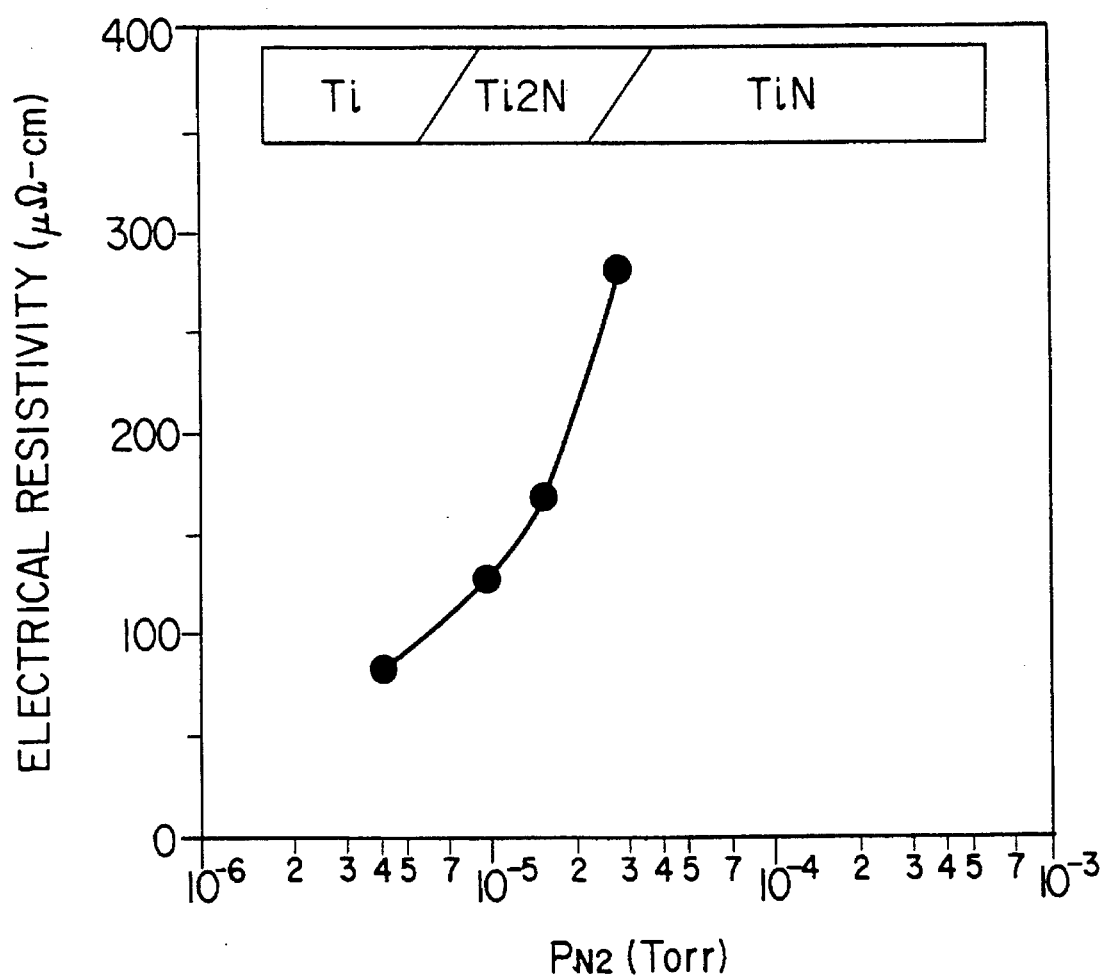
FIG. 5 shows graphically electric resistivities of titanium nitride layers of various composition ratios.

FIG. 5 shows graphically electric resistivities of titanium nitride ($TiN_x$) layers of various composition ratios. As can be seen from this figure, the titanium nitride film exhibits lower electric resistivity as the content of titanium increases with that of nitrogen being decreased.

Figure 6:
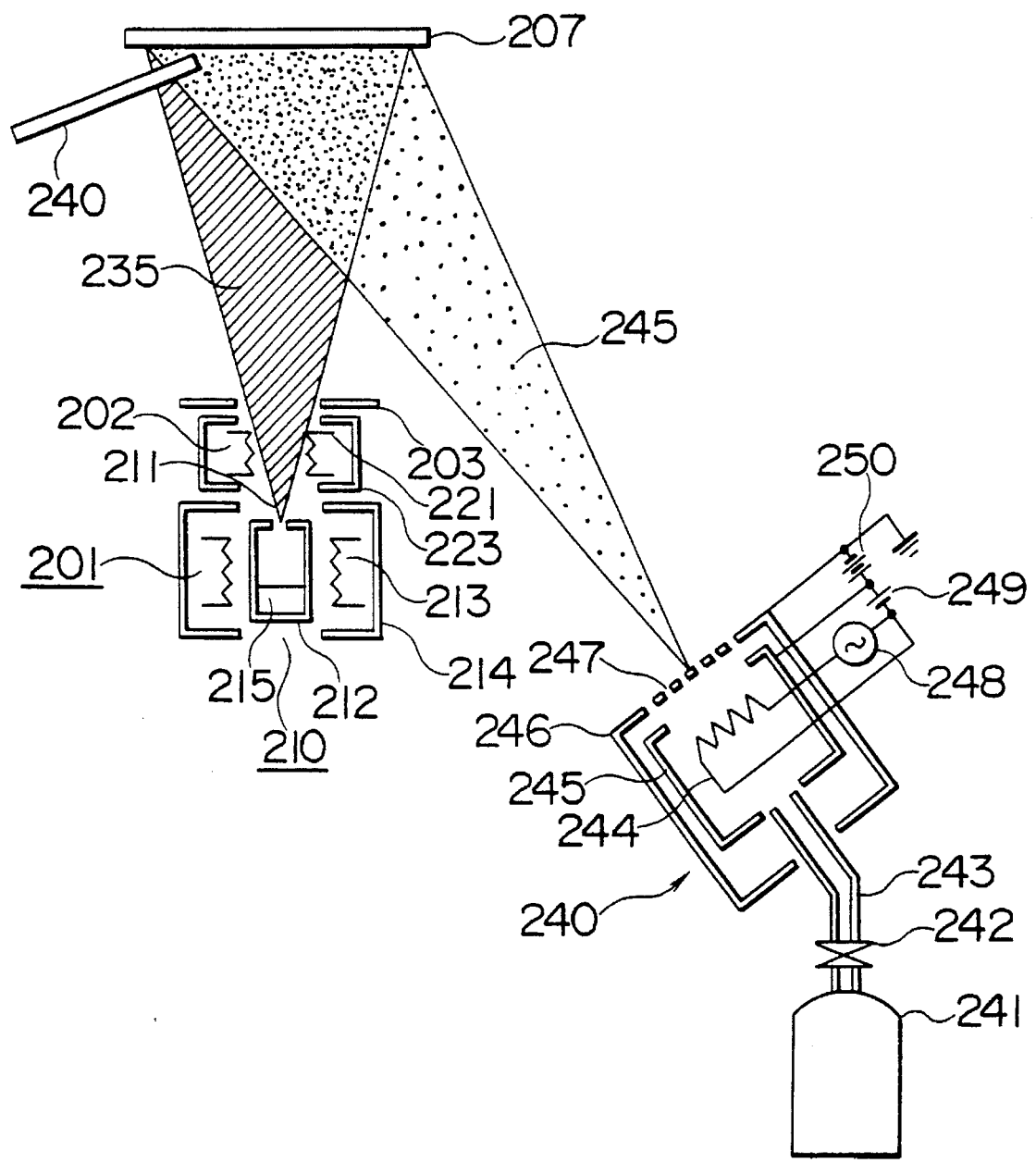
FIG. 6 shows schematically a general arrangement of a thin film forming apparatus according to anther embodiment of the invention.

FIG. 6 shows schematically a general arrangement of a thin film forming apparatus according to another embodiment of the invention. Referring to the figure, the thin film forming apparatus includes a nitrogen gas introducing tube 240 disposed in the vicinity of a substrate 207, an argon gas bomb 241, an argon gas flow regulating valve 242, an argon gas introducing pipe 243, a filament (cathode) 244 constituting an electron beam emitting means, an electron beam drawing electrode (anode) 245 for forming plasma internally thereof, an accelerating means 247 for accelerating controllably ions to thereby irradiate the substrate with ions through an perforated electrode 247, a filament heating power supply source 248 for heating the filament 244 constituting the electron beam emitting means, a DC power supply 249 for biasing the electron beam drawing electrode 245 with positive potential relative to the filament 244 functioning as the electron beam emitting means, and a DC power supply 250 for biasing the electron beam drawing electrode 245 with positive potential relative to the accelerating electrode 246.

Next, description will be made of operation of the thin film forming apparatus of the structure described above. A nitrogen gas is introduced into a vacuum chamber (not shown) held under high vacuum by an evacuating system (also shown) through the gas introducing pipe 240 disposed in the vicinity of the substrate 207. On the other hand, by manipulating the flow regulation valve 242, argon gas which is an inactive gas is introduced from the argon gas bomb 241 to the electron beam drawing electrode 245 disposed within the gas ion source by way of the argon gas introducing pipe 243 to thereby regulate the gas pressure within the vacuum chamber to be on the order of $10^{-5}$ to $10^{-3}$ Torr in terms of a sum of the argon partial pressure and the nitrogen partial pressure. By applying a bias voltage from the DC power supply source 249 so that electron beam is emitted from the filament 244 serving as the electron beam emitting means and heated by the filament heating power supply source in the direction toward the electron beam drawing electrode 255, the thermal electrons as emitted collide with argon gas particles within the electron beam drawing electrode 245, resulting in generation of plasma and ionization. The nitrogen ions as generated are subjected to acceleration under the action of the electric field generated by the accelerating electrode 246 to irradiate the substrate 207 after passing through the perforated 247.

Subsequently, the crucible 212 is heated by the crucible heating filament 213 up to a temperature which corresponds to the intra-crucible vapor pressure of several Torrs. Then, titanium 215 is vaporized and ejected from the nozzle 211. The titanium vapor particles or clusters 216 undergoes then partial ionization by electrons emitted from the ionizing filament 221 to be subsequently accelerated under the influence of the electric field generated by the accelerating electrode 203 and finally collide against the substrate 207 together with vapor or clusters not ionized.

On the other hand, there exists in the vicinity of the substrate 207 the nitrogen gas supplied from the gas introducing pipe 240. The nitrogen gas is in the activated state, being excited, dissociated or ionized under irradiation of argon ions. Consequently, collision takes place between these nitrogen gas particles and the titanium vapor or cluster, resulting in that reaction for forming a titanium oxide-titanium nitride film on the substrate 207 through deposition is promoted. At that time, by varying the quantity of nitrogen ions with which the substrate 207 is irradiated, the ratio of composition between titanium and nitrogen in the film being formed can correspondingly be changed. In other words, the film composition ratio can be controlled as described. Further, since the nitrogen gas introduced to a location close to the substrate is deposited on the substrate 207 while being activated under irradiation with the inactive gas ions, the efficiency of reaction with the vapor or cluster is enhanced, assuring this formation of a thin film which can enjoy an improvement of quality.

In the foregoing, it has been described that the nitrogen gas is introduced to a region lying in the vicinity of the substrate 207 by means of the supply pipe 240, it should be understood that the nitrogen gas may be replaced by a mixture gas containing a nitrogen gas or a mixture gas containing nitrogen elements, to the essentially same effect.

Figure 7:
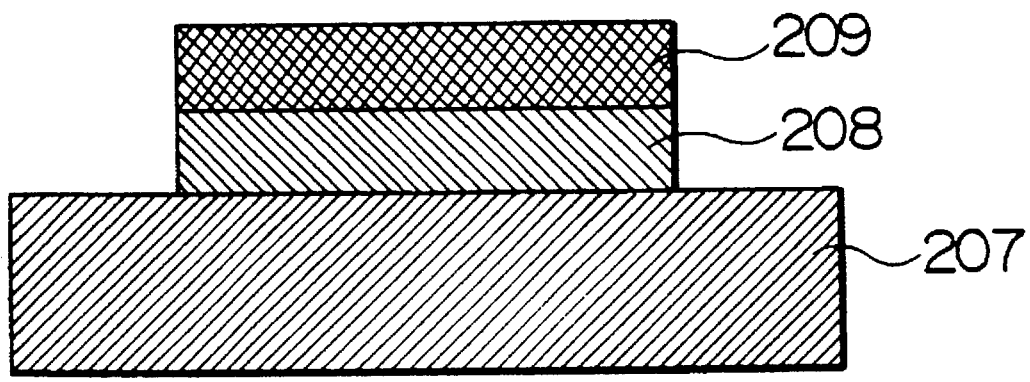
FIG. 7 is a sectional view showing a large scale circuit device according to a further embodiment of the invention.

Furthermore, by introducing an oxygen gas or oxygen elements instead of the nitrogen gas through the introducing tube 240, it is possible to manufacture a LSI device which includes a barrier layer 208 formed of titanium oxide-titanium nitride between the titanium layer 209 and the substrate 207, as shown in FIG. 7. In this case, there exists in the region located along or close to the substrate 207 an oxygen gas supplied from the gas introducing tube 240, which oxygen gas is in the active state, being excited, dissociated or ionized under irradiation with the nitrogen ions, resulting in promotion of collision with the titanium vapor or cluster and hence deposition of the titanium oxide-titanium nitride film 208 on the substrate with a high efficiency. By varying the amount of the nitrogen ions with which the substrate 7 is irradiated, the ratio of composition of oxygen and nitrogen in the film changes correspondingly. Thus, control of the composition ratio between oxygen and nitrogen contained in the thin film can be performed in an extremely simplified and facilitated manner.

It should further be mentioned that a mixture gas containing oxygen and nitrogen gases or alternatively a mixture gas containing oxygen elements and nitrogen elements may be introduced to the vicinity of the substrate 207 through the supply pipe 240. In this case, while introducing the mixture gas containing oxygen and nitrogen gases or oxygen and nitrogen element to the substrate 207 via the gas introducing pipe 240, the flow regulating valve 242 installed on the argon supply pipe extending from the argon bomb 241 is manipulated to thereby control the amount of argon gas introduced to the electron drawing electrode 245 of the gas ion source so that the gas pressure within the vacuum chamber is at a level in a range of $10^{-5}$ to $10^{-3}$ Torr in terms of a sum of the partial pressure of the oxygen/nitrogen mixture gas and that of the argon gas. The thermal electrons emitted toward the electron beam drawing electrode 245 then collide with the argon gas within the electrode 245 to thereby ionize the latter to form plasma. The argon ions thus produced are accelerated under the effect of the electric field generated by the accelerating electrode 246 to irradiate the substrate 207 after passing through the perforated electrode 247.

As is with the case described hereinbefore, there prevails at a region located along or in the vicinity of the substrate 207 the mixed gas of oxygen and nitrogen gases supplied from the gas introducing pipe 240 in the activated state being excited, dissociated or ionized under irradiation of argon ions. Consequently, collision with the titanium vapor or cluster resulting in that reaction for forming a titanium oxide-titanium nitride film on the substrate 207 through deposition is promoted. At that time, by varying the mixing ratio of oxygen and nitrogen gases under irradiation of the argon ions, the ratio of composition between oxygen and nitrogen in the film being formed can correspondingly be changed. In this manner, the film composition ratio can freely be controlled as described.

With the structure of the thin film forming apparatus according to the instant embodiment of the invention, not only the efficiency of reaction with the vapor or clusters can be enhanced but also the composition ratio between oxygen and nitrogen can arbitrarily be changed, whereby a titanium oxide-titanium nitride thin film of a high quality can be formed. Since the barrier layer underlying the wiring conductor layer is constituted by the titanium oxide-titanium nitride thin film in the LSI device manufactured through the process described above, interaction and diffusion between the wiring conductor layer and the insulation layer can be suppressed to a maximum to thereby enhance the intrinsic property as the barrier.

Figure 8:
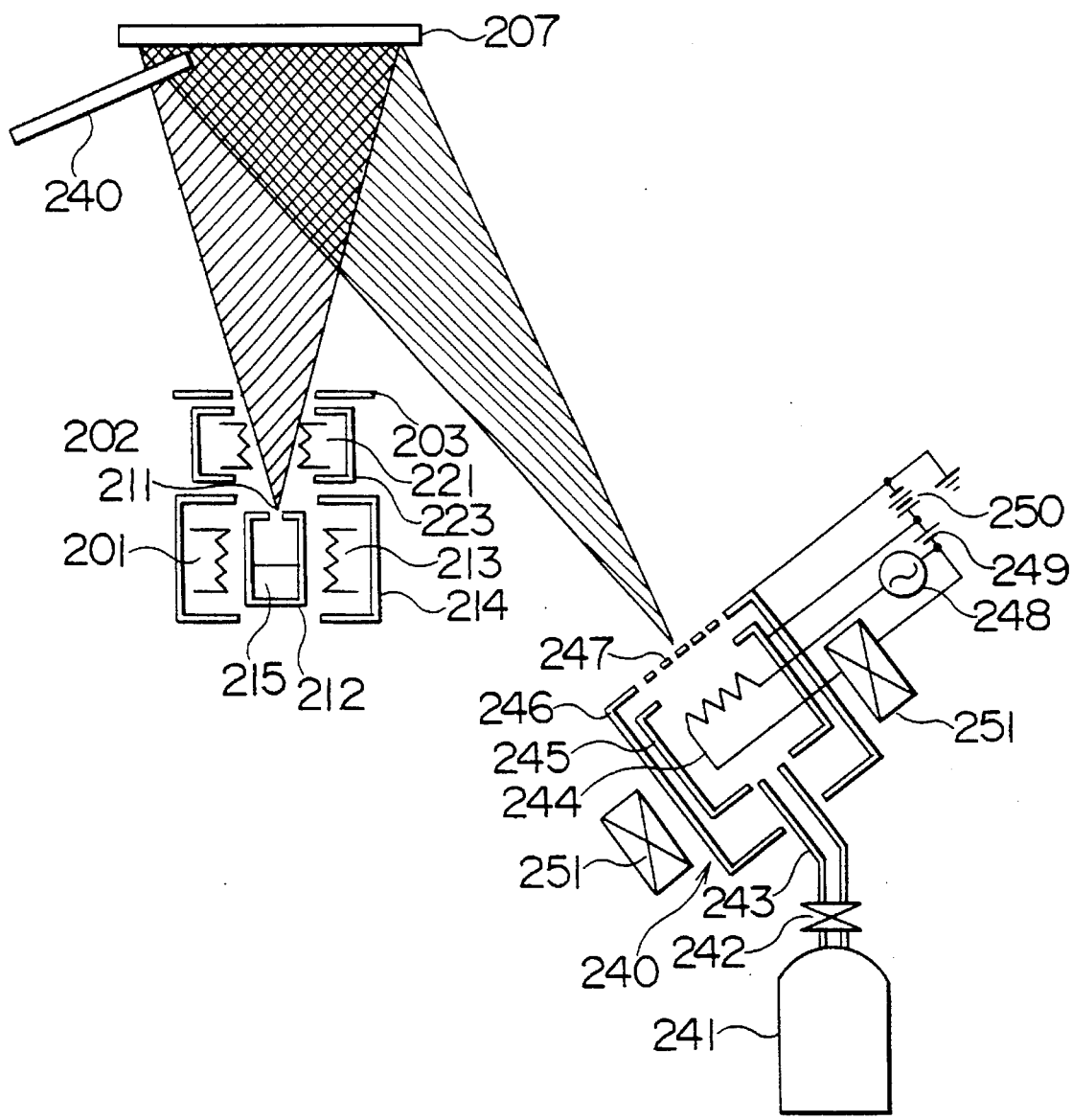
FIG. 8 shows a thin film forming apparatus according to a further embodiment of the invention.

FIG. 8 shows a thin film forming apparatus according to a further embodiment of the invention. This apparatus differs from that shown in FIG. 6 in that a magnetic field applying means 251 is additionally disposed externally around the gas ion source 240.

Operation of the thin film forming apparatus shown in FIG. 8 will briefly be described below.

As in the case of the embodiment described hereinbefore by reference to FIG. 6, a nitrogen gas is introduced into the gas ion source 240 through the gas introducing pipe 243 under such control that the gas pressure within the vacuum chamber lies approximately in a range from $10^{-5}$ to $10^{-3}$ Torr in combination with the oxygen gas introduced to the vicinity of the substrate 207 by the gas introducing pipe 243. Electrons are emitted from the electron beam emitting means 244 toward the electron beam drawing electrode 245 to thereby ionize the nitrogen gas in the plasma. At that time, the electrons are forced to perform spiral motions under a magnetic field applied by the magnetic field applying means provided externally of the ion source, whereby the rate of ionization of nitrogen gas is increased.

The ionized nitrogen gas is accelerated in the direction toward the substrate 207 to activate oxygen gas in the vicinity of the substrate 207. Oxygen gas thus activated undergoes reaction with titanium vapor or cluster generated by the ICB source to form a titanium oxide-titanium nitride film, as in the case of the embodiment illustrated in FIG. 6.

Figure 9:
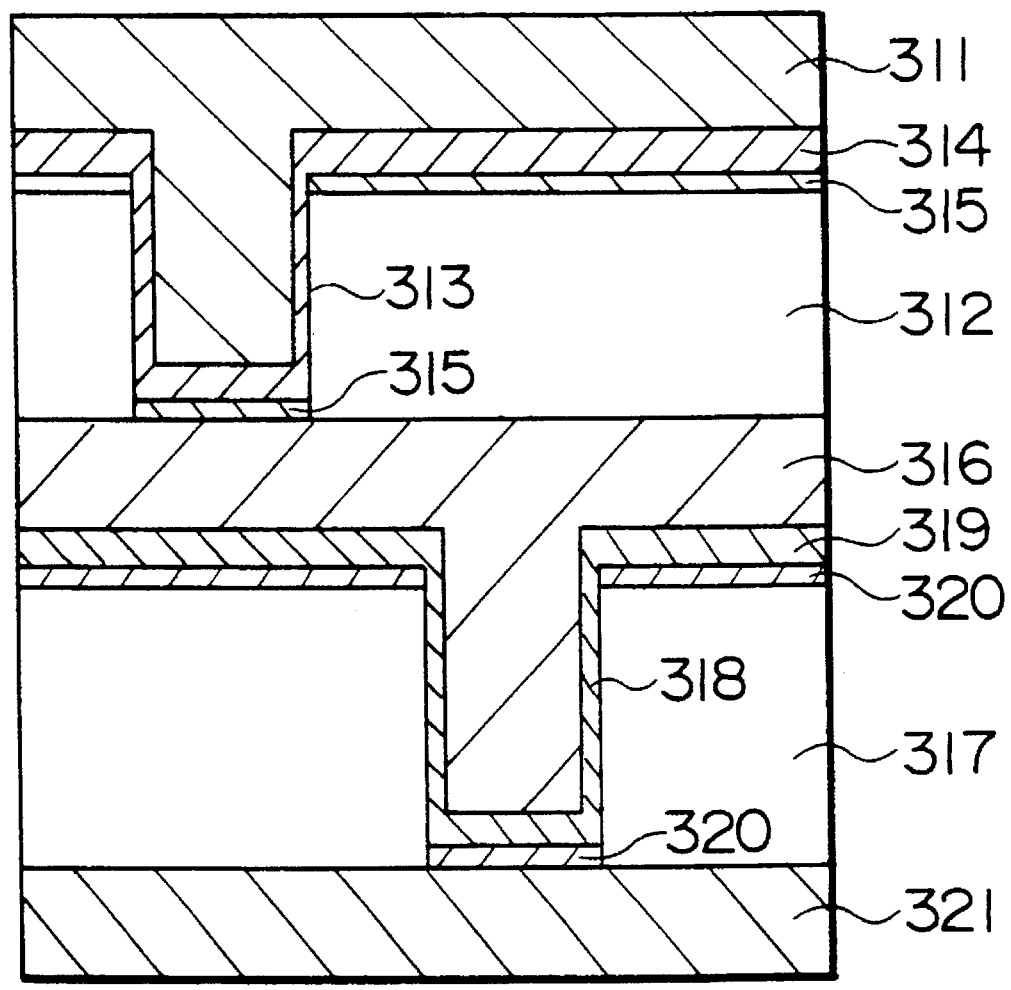
FIG. 9 is a schematic sectional view showing a structure of an integrated circuit device manufactured according to a still further embodiment of the invention.

FIG. 9 is a schematic sectional view showing a structure of an integrated circuit device according to a still further embodiment of the invention. Referring to the figure, the integrated circuit device includes a second metal wiring conductor layer 311 formed of a metal such as an aluminum-silicon-copper alloy or the like, a second inter-layer insulation layer 312, a second inter-layer connecting plug 313, a second barrier layer 314, a second contact layer 315, a first metal wiring conductor layer 316 formed of a metal such as an aluminum-silicon-copper alloy or the like, a first inter-layer insulation layer 317, a first inter layer connecting plug 318, a first barrier layer 319, a first contact layer 320 and a silicon substrate 321.

In the case of the IC device according to the instant embodiment, each of the first and second barrier layers 319 and 314 is formed of a titanium nitride composition containing oxygen and carbon, while the other layers are formed of materials similar to those used for the corresponding layers in the devices known heretofore. By employing the titanium nitride composition containing oxygen and carbon for forming the barrier layer, crystals of titanium oxide as well as crystals of titanium carbide can be incorporated in the titanium nitride layer. Thus, the barrier layer of concern can exhibit a barrier property chemically stabilized. Consequently, diffusion of alloy between the first metal wiring conductor layer 316 and the silicon substrate 321 as well as between the first metal wiring conductor layer 316 and the first inter-layer insulation layer 317 can be positively prevented owing to the presence of the first barrier layer 319. On the other hand, the second barrier layer 314 is effective for preventing diffusion of alloy between the first and second metal wiring layers 316 and 311 as well as between the second metal wiring conductor layer 311 and the second inter-layer insulation layer 312.

In the first and second barrier layers 319 and 314, the content of oxygen should preferably in a range of 5 to 20 atomic % with that of carbon preferably ranging from 5 to 20 atomic % so that a total content of oxygen and carbon lies within a range of 5 to 20 atomic %. Parenthetically, oxygen and carbon may be contained either in the form of elements or in the form of compounds with titanium. It is noted that in case the total content of oxygen and carbon is less than 5 atomic %, the barrier property of the layers 314 and 319 is not satisfactory. On the other hand, increase of the total content of both elements beyond 20 atomic % does not result in any appreciable improvement of the barrier property.

It is further noted that in the case of the integrated circuit device shown in FIG. 9, there are provided the second contact layer 315 and the first contact layer 320 each formed of titanium in thickness less than 50 Å as the underlying layers for the barrier layers 314 and 319, respectively. By virtue of the presence of the second contact layer 315, the electric contact between the second barrier layer 314 on one hand and the first metal wiring conductor layer 316 and the second inter-layer insulation layer on the other hand can be increased, while owing to the first contact layer 320, electric contact between the first barrier layer 319 on one hand and the silicon substrate 321 and the first inter-layer insulation layer 319 can be improved. Besides, carbon and/or oxygen contained in the contact layers 315 and 320 contribute to ensuring high electric stability of these layers 315 and 326. With regard to the carbon and/or oxygen content of the contact layer 315; 320, it is preferred that the oxygen content is less than 3 atomic % with the carbon content of less than 3 atomic %. At this juncture, it should be added that in case both of oxygen and carbon are simultaneously contained, the contents of these elements should preferably be less than 3 atomic %, respectively, because the content exceeding 3 atomic % undesirably increase the electric resistance value of the first contact layer 320. Parenthetically, carbon and/or oxygen may be contained in the form of element(s) or as a compound or compounds with titanium.

In the integrated circuit device shown in FIG. 9, both of the barrier layers 314 and 319 and both of the contact layers 315 and 320 are implemented in the structures or compositions described above, respectively. It should however be understood that only one of the barrier layers as well as only one of the contact layers may be realized in the respective structures described above without departing from the spirit and scope of the invention.

As a modification of the integrated circuit device shown in FIG. 9, the first and second barrier layers 319 and 314 may be formed each of titanium nitride containing carbon. In this case, titanium carbon crystal can be formed in the titanium nitride layer, whereby higher stabilized barrier property can be imparted to the barrier layer. Accordingly, this modification can provide advantageous effects similar to those of the integrated circuit structure shown in FIG. 9.

In an experiment performed for testing the integrated circuit device manufactured according to the inventions, IC devices whose oxygen and/or carbon contents are varied as shown in the undermentioned table 1 are manufactured and compared with a control device (containing neither oxygen nor carbon). The devices according to the invention as well as the device for control are manufactured by depositing the barrier layers of titanium nitride and the wiring conductor layers of aluminum successively on a silicon substrate to thereby realize laminated structures.

The device according to the invention was heated for one hour at a temperature of 500° to 800° C. in order to promote thermal diffusion of silicon into the metal wiring conductor layer. After heating, the device under text was cooled and sliced, and then a section of the device was photographed with a magnification factor of 50000 for visual examination of the states of the silicon layer, the barrier layer and the metal wiring conductor layer. The device for control was treated and observed through similar procedure. The results are shown in the table 1.

As can be seen from this table, in the case of the integrated circuit device manufactured according to the invention, the wiring conductor layer formed of aluminum presents a color of white while uniformly over the whole exposed area. In contrast, in the case of the device for control, turbidity was observed in the wiring conductor layer. Such turbidity can be explained by the diffusion of silicon into the wiring conductor layer beyond the barrier layer. In contrast, in the case of the device manufactured according to the invention, absence of such turbidity shows that thermal diffusion of silicon could positively be inhibited by the barrier layer which contains oxygen and carbon.

TABLE 1

|  |  | Oxygen Contents (Atomic %) | | | |
| --- | --- | --- | --- | --- | --- |
|  |  | 0 | 5 | 10 | 20 |
| Carbon Contents | 0 | x | Δ | o | o |
| (Atomic %) | 5 | Δ | o | o | o |
|  | 10 | o | o | o | Δ |
|  | 20 | o | o | Δ | Δ |

In the above table, marks "o" indicate the state in which no turbidity occurred in the wiring conductor layer, "Δ" indicate the state in which turbidity of less significance was observed, and "x" indicate the state in which turbidity of more significance was observed.

Figure 10:
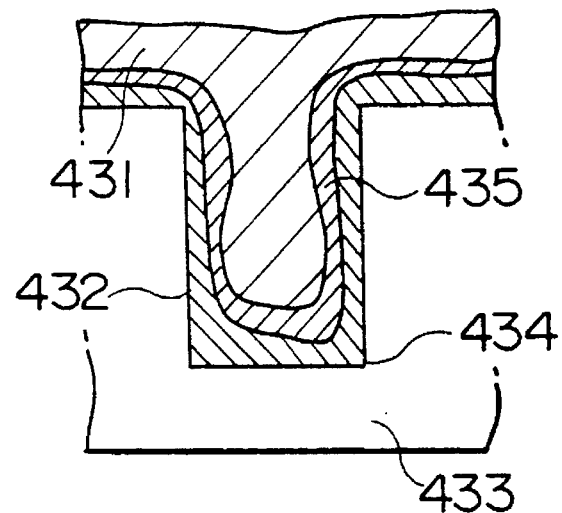
FIG. 10 is a partial sectional view of an integrated circuit device manufactured according to another embodiment of the invention.

FIG. 10 is a partial sectional view of an integrated circuit device according to a further embodiment of the present invention. Referring to the figure, the semiconductor device under consideration is composed of a wiring conductor layer 431 formed of aluminum or an aluminum alloy, a barrier layer 432 of titanium nitride, a silicon substrate 433, a contact hole 434 and a buffer layer disposed between the wiring conductor layer 431 and the barrier layer 432 and formed of a metal which is capable of easily forming an alloy with a metal of the wiring conductor layer 431. As the metal for the buffer layer 435 which is easy to form an alloy with aluminum or an aluminum alloy of the wiring conductor layer 431, there may be mentioned, for example, titanium, silicon, germanium or the like.

Description will now be directed to a process of forming the wiring conductor layer in the integrated circuit device according to the instant embodiment. At first, the barrier layer 432 is formed of titanium nitride or the like within the contact hole 434, which is then followed by formation of the buffer layer 435 of titanium, silicon, germanium or the like metal. Since the metal such as titanium, silicon and germanium has a tendency easy to form an alloy with aluminum, it can alloy with aluminum or an aluminum alloy of the wiring conductor layer 431 deposited on the buffer layer 435 to thereby form an aluminum alloy layer along the interface between the buffer layer 435 and the wiring conductor layer 431 by heating only slightly the silicon substrate, because such aluminum alloy has a significantly low melting point as compared with pure aluminum or an aluminum alloy having a large content of aluminum. Thus, the wiring conductor layer 431 is easily fluidized to bury the contact hole 434. In this way, the contact hole 434 can be buried with the wiring conductor layer 31 satisfactorily in a much facilitated manner.

Next, description will be made of an apparatus which can be used for forming the wiring conductor layer in the contact hole, as described above, by reference to FIGS. 12 and 13. This apparatus generally denoted by a numeral 450 is composed of a rotational driving mechanism 451 disposed within a vacuum chamber (not shown) for rotating a silicon substrate 433, a heating means 452 disposed at the rear side of the silicon substrate 433 supported on the rotational driving mechanism 451 for heating the silicon substrate 433, a vapor generating source 453 including a spot light source for depositing vapor or cluster of a metal such as titanium, silicon, germanium or the like or the silicon substrate 433 heated by the heating means 452, and second vapor generating source 454 including a spot light source for depositing vapor or cluster of aluminum or an aluminum ally, wherein the metal vapor or cluster are generated by the vapor generating source 453 and 454 while rotating the rotational driving mechanism 451 to thereby form a buffer layer 435 and a wiring conductor layer 431 in a contact hole 431 (FIG. 10) of the silicon substrate 433. Further, the manufacturing apparatus 450 includes an ionizing means (not shown) for ionizing vapor or cluster generated by the vapor generating sources 453 and 454, and a controllable accelerating means (also not shown) for accelerating the ionized vapor or cluster toward the silicon substrate 33.

Next, description will be made of a method of manufacturing an integrated circuit device of the structure shown in FIG. 10 by using the manufacturing apparatus 450. First, the vacuum chamber is evacuated to a vacuum level lower than $10^{-4}$ Torr by means of an evacuating system (not shown). Thereafter, metal such as titanium, silicon, germanium or the like is evaporated from the vapor generating source 453, which vapor is ejected toward the silicon substrate 433 by accelerating the vapor in the vacuum space by the ionizing means and the accelerating means, while the silicon substrate 433 is heated by the heater means 452 with the silicon substrate 433 being rotated by the rotational driving means 451. In this manner, the metal vapor or cluster of titanium, silicon, germanium or the like is deposited in the contact hole 434 of the silicon substrate 433 to thereby form the buffer layer 435. Subsequently, aluminum or an aluminum alloy is vaporized from the vapor generating source 455 while heating the silicon substrate 433 by the heater means 452 to thereby allow aluminum or aluminum alloy to be deposited in the contact hole 434 to form the wiring conductor layer 431. At that time, aluminum or aluminum alloy deposited on the buffer layer 435 will mix with a metal such as titanium, silicon, germanium or the like to form an alloy which is fluidized to flow into the contact hole 434 while forming the wiring conductor layer 431.

As is apparent from the above description, according to the instant embodiment of the invention, the buffer layer 435 is first provided on the barrier layer 432 deposited within the contact hole and then the wiring conductor layer 431 is formed in the contact hole 434 while allowing the metal of the buffer layer 435 to alloy with that of the wiring conductor layer 431. Thus, even in the case of the contact hole of a very small size having a high aspect ratio, the wiring conductor layer 431 can easily flow into the contact hole 431 because of fluidization of the wiring conductor layer 431 within the contact hole 434. Thus, the wiring conductor layer 431 can be formed without fail.

Figure 11:
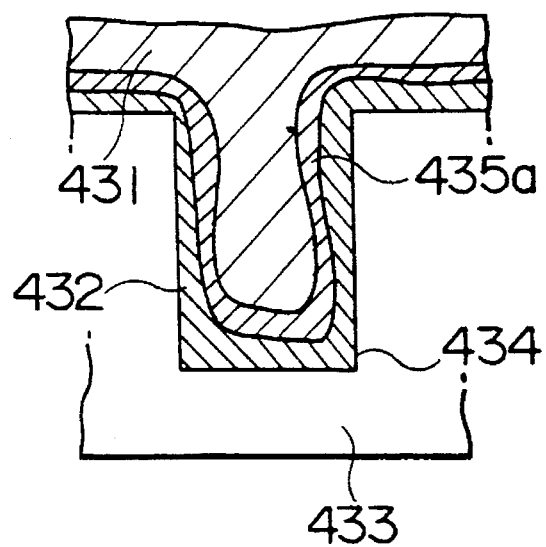
FIG. 11 is a sectional view showing a semiconductor circuit device according to yet another embodiment of the invention.

FIG. 11 is a sectional view showing a semiconductor circuit device according to another embodiment of the invention. The integrated circuit device according to the instant embodiment differs from the device shown in FIG. 10 only in respect to the metal composition of the buffer layer 435a. Accordingly, same or equivalent components are denoted by like reference numerals used in FIG. 10. The buffer layer 435a of the integrated circuit device according to the instant embodiment is formed of a alloy of a metal such as titanium, silicon, germanium or the like with an aluminum alloy.

Figure 12:
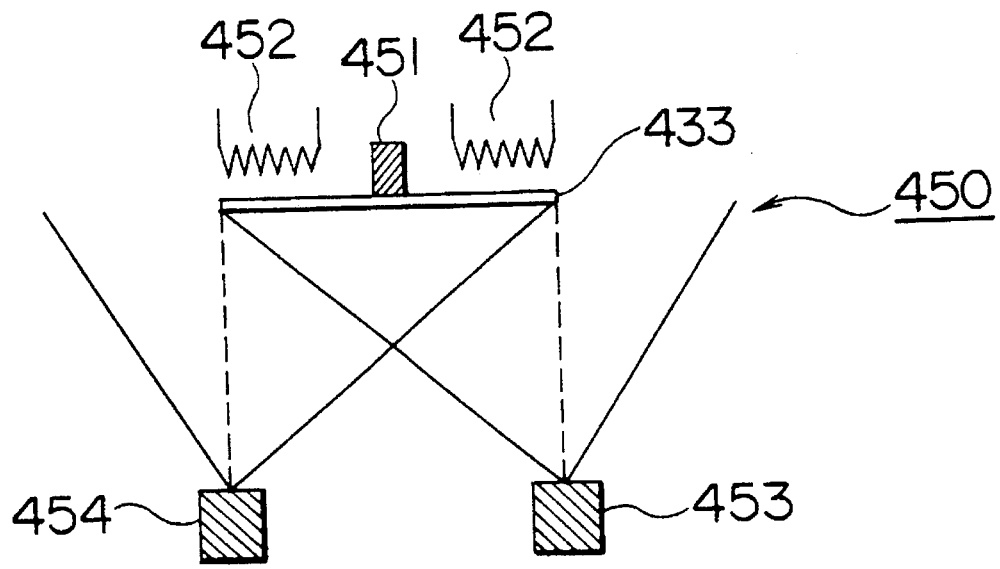
FIG. 12 is a schematic elevational view of a thin film forming apparatus according to a further embodiment of the invention.
Figure 13:
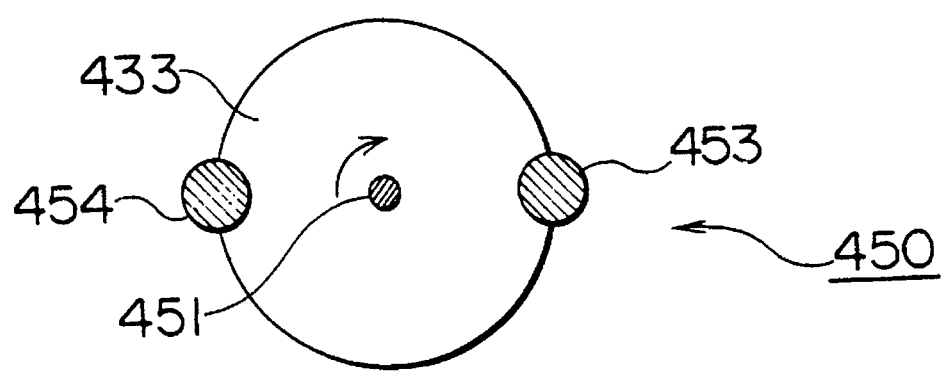
FIG. 13 is a schematic top plan view of the same.

When the integrated circuit device according to the instant embodiment is manufactured by using the apparatus shown in FIG. 12, titanium, silicon, germanium or the like is vaporized from the vapor generating source 453 and at the same time, aluminum or an aluminum alloy is evaporated from the vapor generating source 454, so that both metals are simultaneously deposited within the contact hole 434 of the silicon substrate to thereby form the buffer layer 435a of an alloy of the metal such as titanium, silicon, germanium or the like with an aluminum alloy. Except for this step, the contact hole 434 can easily be buried with a metal forming the wiring conductor layer upon deposition thereof in the same manner as described above by reference to FIG. 10.

As a modification of the embodiment shown in FIG. 11, the buffer layer 435a may be formed such that the content of the metal such as titanium, silicon, germanium or the like decreases progressively relative to the content of aluminum as the distance to the wiring conductor layer from the buffer layer 435a decreases. To this end, in the simultaneous deposition of the metal such as titanium, silicon, germanium or the like with aluminum or the aluminum alloy, the evaporation amount of the former may progressively decreased or alternatively the evaporation amount of the latter may progressively increased in the course of the vapor deposition.

By providing on the surface of the barrier layer 432a formed in the contact hole 434 the buffer layer 435 whose aluminum content progressively decreases as the distance to the wiring conductor layer 431 decreases, aluminum or an aluminum alloy forming the wiring conductor layer 431 will mix with an alloy of the surface of the buffer layer 435 upon burying the contact hole by the wiring conductor layer 431, as a result of which the melting point of metal forming the wiring conductor layer 431 becomes lower to allow the alloy to be fluidized within the contact hole 434, resulting in that burying of the contact hole with the metal of the wiring conductor layer can be promoted to facilitate this burying process.

Although titanium, silicon or germanium has been mentioned as a metal for forming the buffer layer in conjunction with the modifications of the embodiments shown in FIGS. 10 and 11, it should be appreciated that the present invention is never restricted to titanium, silicon and germanium, but other metal which is capable of easily alloying with aluminum can equally be employed within the purview of the present invention. Further, it goes without saying that in case a substrate has a contact hole and a through-hole, the buffer layer may be provided in both of these holes.

Figure 14:
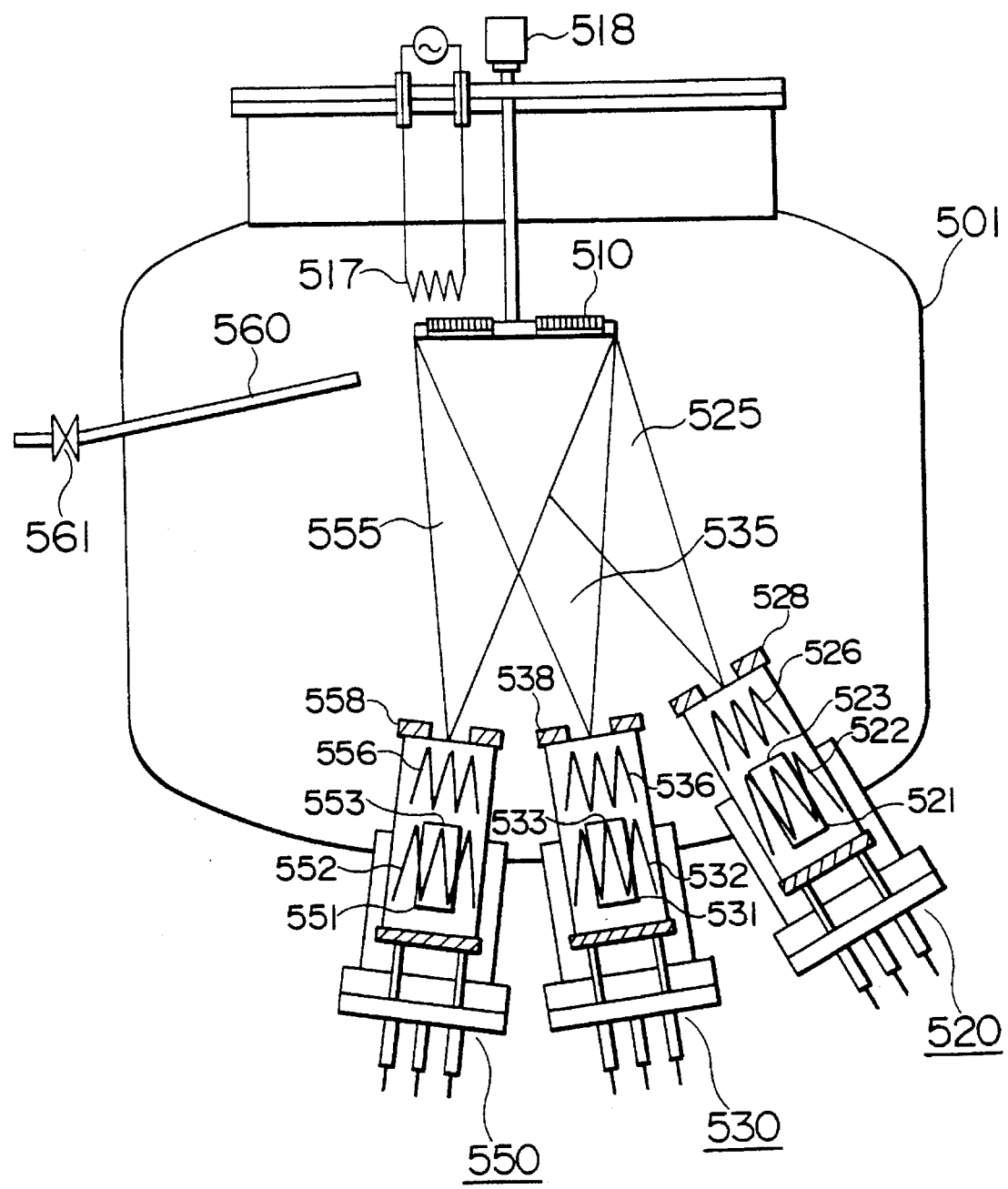
FIG. 14 is a diagram showing schematically a still structure of a thin film forming apparatus according to a further embodiment of the invention.

FIG. 14 is a diagram showing schematically a structure of a thin film forming apparatus according to a further embodiment of the invention. Referring to the figure, the apparatus is composed of a vacuum chamber 501, a substrate 510 which is disposed within the vacuum chamber 501 and which is to be formed with a wiring conductor layer, a rotating a mechanism 518 for rotating the substrate 510, a heater 517 for heating the substrate 510, and cluster ion beam type ion beam vapor deposition units which are filled with materials for vapor deposition, i.e., aluminum, copper and silicon, respectively ad disposed underneath a substrate 510 in such orientation as to face vertically upwardly. The ion beam vapor deposition units 520, 530 and 535 includes crucibles 521, 532 and 551 which are filled with the above-mentioned materials for vapor deposition, respectively, crucible heating filaments 522, 532 and 552 for heating the crucibles 521, 531 and 551, respectively, and nozzles 523, 533 and 553 provided for the crucibles 521, 531 and 551, respectively. Vapors or clusters 525, 535 and 555 generated from the associated crucibles 521, 531 and 551 are ionized by ionization filaments 526, 536 and 556, respectively, and accelerated in the direction toward the substrate 510 to irradiate the same by means of accelerating electrodes 528, 538 and 558, respectively. A gas introducing pipe 560 is provided for introducing an argon gas into the vacuum chamber 501 at a location in the vicinity of the substrate 510. A flow regulating valve 561 is installed in association with the argon gas introducing pipe 560 for controlling the gas pressure within the vacuum chamber 501 at a desired pressure level.

In the thin film forming apparatus of the structure described above, when the cluster ion type vapor deposition apparatus including the vapor deposition unit 520, 530 and 550 is operated, the materials for vapor deposition, i.e., aluminum, copper and silicon placed within the crucibles 521, 531 and 551 are heated by the heater filaments 522, 532 and 552, respectively, resulting in that aluminum, copper and silicon are vaporized to be ejected into the high-vacuum space defined within the vacuum chamber 501 through the respective nozzles 523, 533 and 553, whereby the clusters 525, 535 and 555 are formed, respectively. Parts of these clusters are ionized as the result of collision with electrons emitted from the ionizing filaments 526, 536 and 556, respectively, and undergo acceleration under the action of the electric fields of the accelerating electrodes 528, 538 and 558, respectively, to be finally deposited on an exposed surface of the substrate 510 to form a wiring film thereon. In that case, by controlling bias voltages applied to the accelerating electrodes 528, 538 and 558 to thereby control the kinetic energy of the ionized vapors or clusters with which the substrate 510 is irradiated, while increasing the quantity of electron emitted from the ionizing filaments 526, 636 and 556 to thereby increase the number of irradiating ions, the amount of the clusters deposited at bottoms of fine contact holes of a high aspect ratio can be increased.

As mentioned previously, an argon gas is introduced into the vacuum chamber 501 in the vicinity of the substrate 510 by means of the gas introducing pipe 560. By adjusting the gas pressure within the vacuum chamber 501 by means of the flow regulating valve 561, the mean free paths of the cluster beams 525, 535 and 555, respectively, can be varied. By increasing the gas pressure introduced into the vacuum chamber, collision of the clusters with argon gas particles takes place more intensively, as a result of which the linear traveling paths of the clusters are changed. Consequently, a greater part of clusters tends to be deposited over the cylindrical wall surface of the contact hole when compared with the quantity of clusters deposited on the bottom surface.

Figure 15:
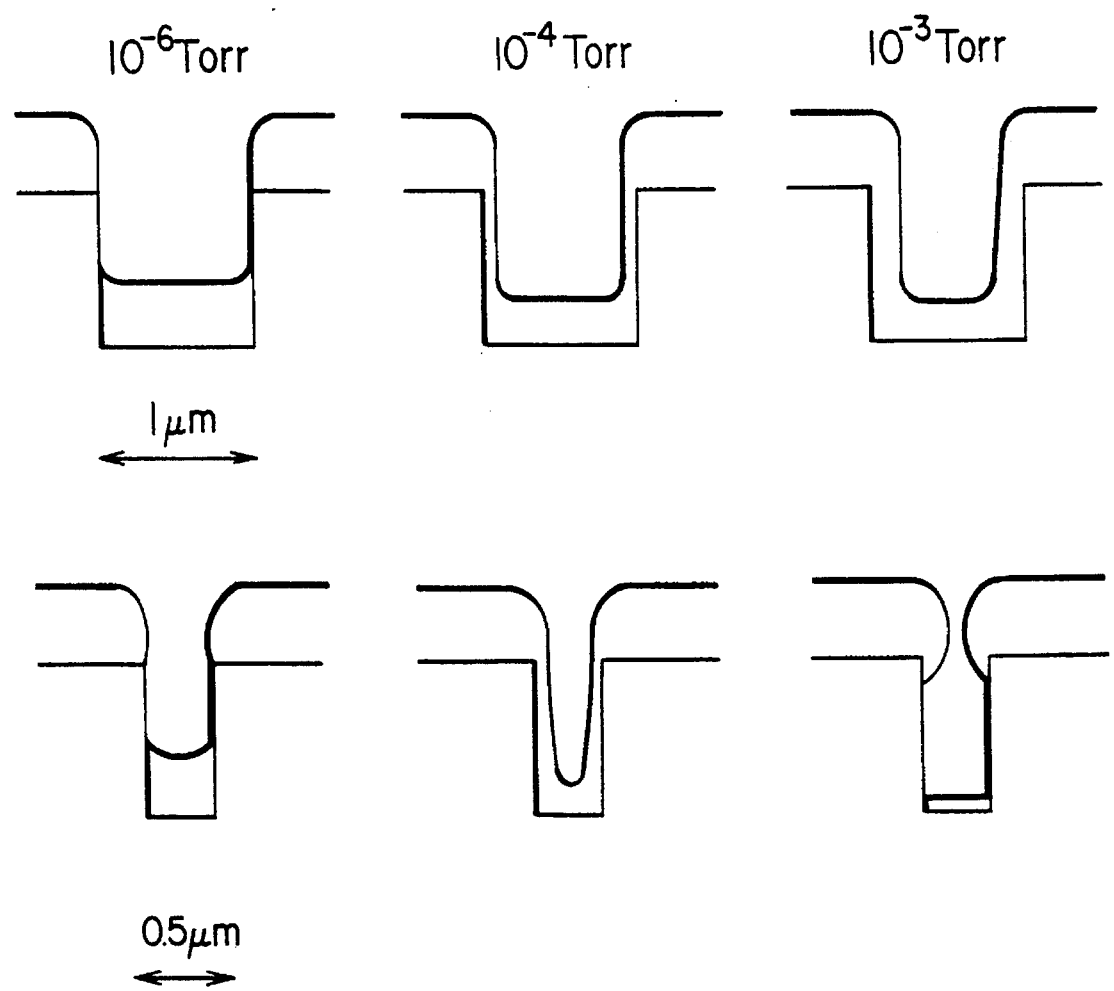
FIG. 15 is a diagram for illustrating operation of the apparatus shown in FIG. 14.

More specifically, referring to FIG. 15, when the gas pressure is as low as on the order of $10^{-6}$ Torr, the mean free path of the cluster exceeds 2500 cm, at which the probability of collision with argon particles is low. Accordingly, the cluster or vapor beam maintains a high linearity in the traveling path. In that case, a greater amount of the clusters will be deposited on the bottom surface of the contact hole while the amount of deposition on the side wall surface decreases correspondingly. On the other hand, when the gas pressure within the chamber 501 is on the order of $10^{-3}$ Torr, the mean free path becomes shorter than 2.5 cm, incurring a high probability of collision with the argon particles. As a consequence, the traveling paths of the cluster particles are bent, resulting in that a greater number of the clusters tends to be deposited on the side wall surface than at the bottom surface of the contact hole. In that case, there may happen such unwanted situation that the amount of deposition at an entrance of the contact hole increases to obstruct the passage into the interior of the hole particularly when the hole is of a minute size on the order of half a micron. Thus, it is preferred to select the vacuum level of the chamber 501 at about $10^{-4}$ Torr which can assure the mean free path length of about 25 cm. In this case, the quantity of deposition on the bottom of the hole is well balanced with that of the deposition on the side wall, whereby an improved coating can be ensured even for a minute structure having an offset portion. Of course, the argon gas pressure should be controlled in dependence on the diameter of the contact hole. By way of example, in the case of the contact hole having a diameter of 0.3 μm requiring an extremely fine processing, the argon gas pressure should preferably be maintained in a range of ca. $10^{-6}$ to ca. $2 \times 10^{-4}$ Torr.

In the above description, it has been assumed that argon gas is used as the gas introduced into the vacuum chamber 501. It should however be mentioned that a rare gas selected from helium, neon, argon, krypton, xenon and radon which do not play any role in forming the wiring conductor film can equally be used substantially to the same effect.

Furthermore, it should be mentioned that the pressure of the rare gas may be varied in the course of formation of the wiring conductor layer. By way of example, in the initial or starting phase of the layer formation, priority may be put to the deposition on the bottom of the contact hole by setting the gas pressure at a low level, and then the gas pressure is increased to thereby form the layer on the side wall of the contact hole. Of course, this procedure may be reversed to substantially same effect.

In the foregoing, it has been described that an inactive rare gas which can not contribute to the film formation as an reactive component is used with a view to adjusting the mean free path of the cluster or vaporized material for deposition. In this conjunction, let's suppose that air is used in place of the rare gas for the purpose of controlling the mean free path of concern. In that case, there will be produced nitrogen ions and oxygen ions through the ionization process, which may lead to such undesirable situation that the wiring conductor layer of a desired composition can not be formed because of inclusion or addition of nitrides and oxides upon film formation through the vapor deposition process. However, this problem can be ascribed to the gas pressure within the vacuum chamber 501. In other words, so long as the gas pressure is maintained sufficiently low, the presence of air can affect no influence to the composition of the wiring conductor layer or film. It has experimentally been established by the inventors that the influence of the air makes appearance at a gas pressure not lower than $10^{-6}$ Torr. Thus, at a higher vacuum level than $10^{-6}$ Torr or at the gas pressure lower than $10^{-6}$ Torr, to say in another way, the mean free path of the vaporized material to be deposited from forming a wiring conductor file with a contact hole of an extremely small size can be controlled by varying the vacuum level under the condition mentioned above without a resorting to the introduction of the rare gas. In reality, by varying the vacuum level in the manner as described in the preceding paragraph without introducing the rare gas, there can be formed a wiring conductor film of a satisfactory thickness on the bottom and the side wall even of an extremely small contact hole.

In the case of the apparatus shown in FIG. 14, argon gas is introduced to the vicinity of the substrate 510. This is for the purpose of covering the substrate 510 with an atmosphere of argon gas to select appropriately the mean free path length. However, after lapse of a short time, uniform diffusion of argon gas takes place with disappearance of the partial pressure of argon gas. In view of this fact, the argon gas introducing means may be provided at any appropriate portion of the vacuum chamber 501 without departing from the spirit and scope of the invention.

As the material for vapor deposition, there may be used solely aluminum which is low in electric resistivity and inexpensive. However, in order to suppress migration from occurring in the wiring conductor layer being formed, it is preferred to use a combination of aluminum and copper or a combination of aluminum, copper and a substance selected from a group consisting of silicon, tungsten silicide and titanium silicide with such composition that aluminum ranges from 95 to 99.5% with the other element being from 5 to 0.5%.

In the apparatus shown in FIG. 14, the cluster ion beam type ion beam vapor deposition apparatus is used. It should however be noted that other vapor deposition apparatus such as a vacuum vapor deposition apparatus (inclusive of apparatuses in which source material is vaporized through irradiation with an electron beam and a laser beam), an ion plating apparatus, a molecular beam epitaxial apparatus, an ion beam sputtering apparatus or a physical evaporation apparatus for effecting vapor deposition under high vacuum may equally be employed. However, with a magnetron sputtering apparatus which is one of the physical vapor deposition apparatuses and in which argon gas is introduced at a gas pressure of $10^{-3}$ Torr or higher, it is impossible to control the mean free path of the material for vapor deposition with the aid of argon gas, rendering it possible to coat offset portion with a wiring conductor layer in a satisfactory manner.

Further, in the case of the apparatus shown in FIG. 14, the substrate 510 is adapted to be rotated by the driving mechanism 518. This is for the purpose of realizing a vapor deposition film of uniform composition and film thickness. In this connection, it is to be noted that the invention is never restricted to the use of such rotational driving mechanism. In brief, any suitable mechanism may be employed so far as relative movement can occur between the vapor beams and the substrate. By way of example, the substrate 510 may be moved in the horizontal or vertical direction as viewed in FIG. 14. Of course, the vapor deposition source inclusive of the crucibles 522, 532 and 552 may be moved or alternatively the ion beams may be deflected by applying an electric field or a magnetic field to the substantially same effect.

According to the teachings of the invention incarnated in the instant embodiment and modification thereof described above, there can be formed a wiring conductor film of an adequate thickness not only on a bottom surface but also over side wall surface of a fine contact hole having a high aspect ratio while preventing breakage due to migration because of vapor deposition in which the mean free path of the vapor particles is controlled by rare gas particles introduced at an appropriate pressure.

By maintaining the vacuum chamber at a higher vacuum level than $10^{-6}$ Torr, it is possible to form a wiring conductor layer of a sufficient thickness on the bottom surface as well as the side wall of a fine contact hole having a high aspect ratio while preventing breakage due to migration even without resorting to the introduction of rare gas.

Besides, relative movement between the vapor beam and the substrate can contribute to formation of a wiring conductor film of a uniform thickness.

Figure 16:
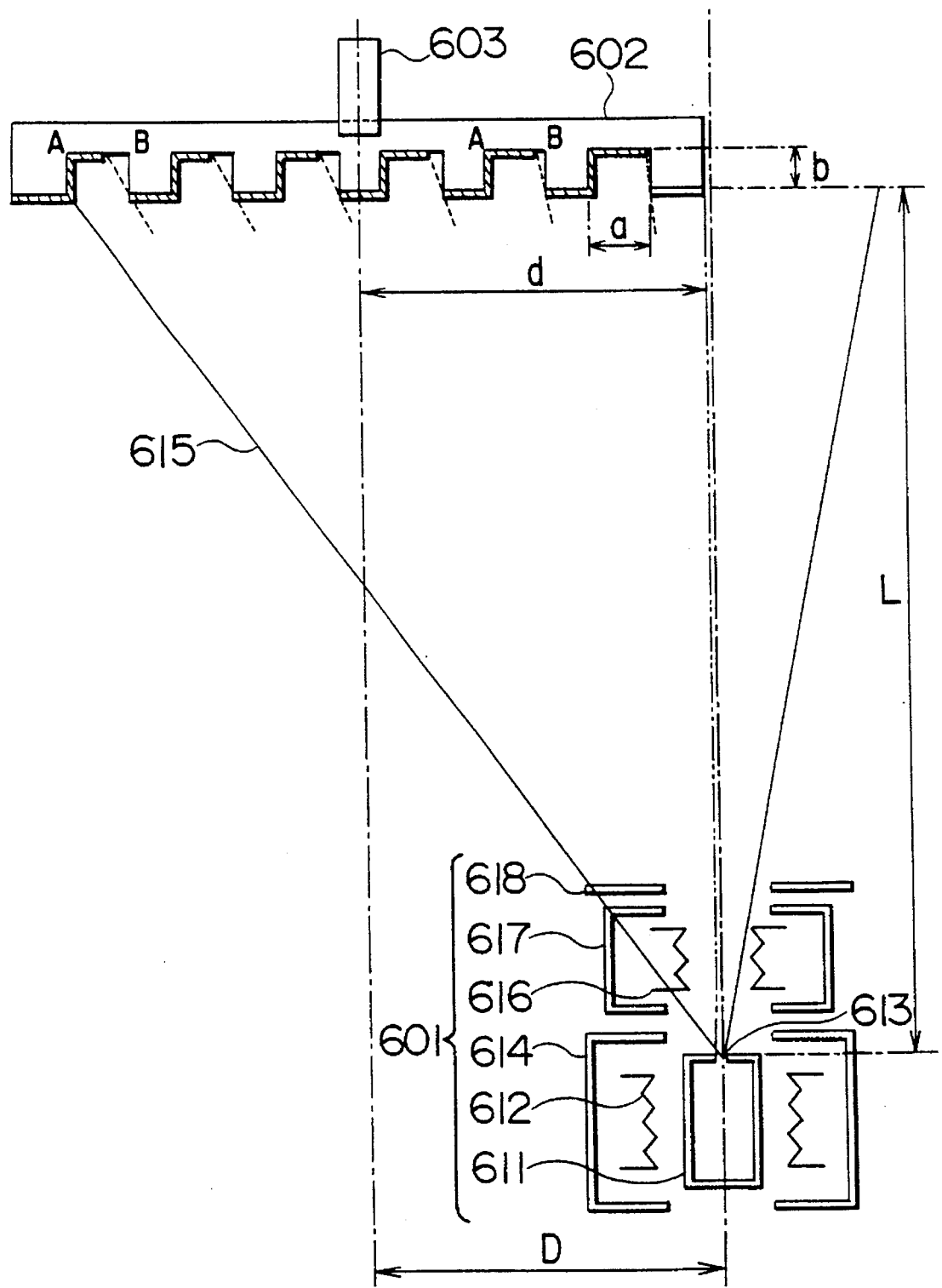
FIG. 16 is a view showing schematically a general arrangement of a thin film forming apparatus according to yet another embodiment of the invention.

FIG. 16 is a view showing schematically a general arrangement of a thin film forming apparatus according to a still further embodiment of the invention.

In this figure, a reference numeral 601 generally denotes a cluster ion beam evaporation spot source which includes a crucible 611 filled with an evaporation material (i.e., material to be evaporated for deposition in vapor phase), a heater filament 612 for heating the crucible 611, a nozzle 613 for ejecting in the form of cluster 615 the vapor of the evaporation material vaporized by heating the crucible by the filament 612, a heat shield plate 614 for shielding heat generated by the heater filament 612, an ionizing filament 616 for ionizing the clusters 615 ejected through the nozzle 613, a heat shield plate 617 for shielding heat of the ionizing filament 616, and an accelerating electrode 618 for accelerating the ionized cluster 615 for thereby irradiating a substrate 602 with the accelerated cluster ions.

Figure 32:
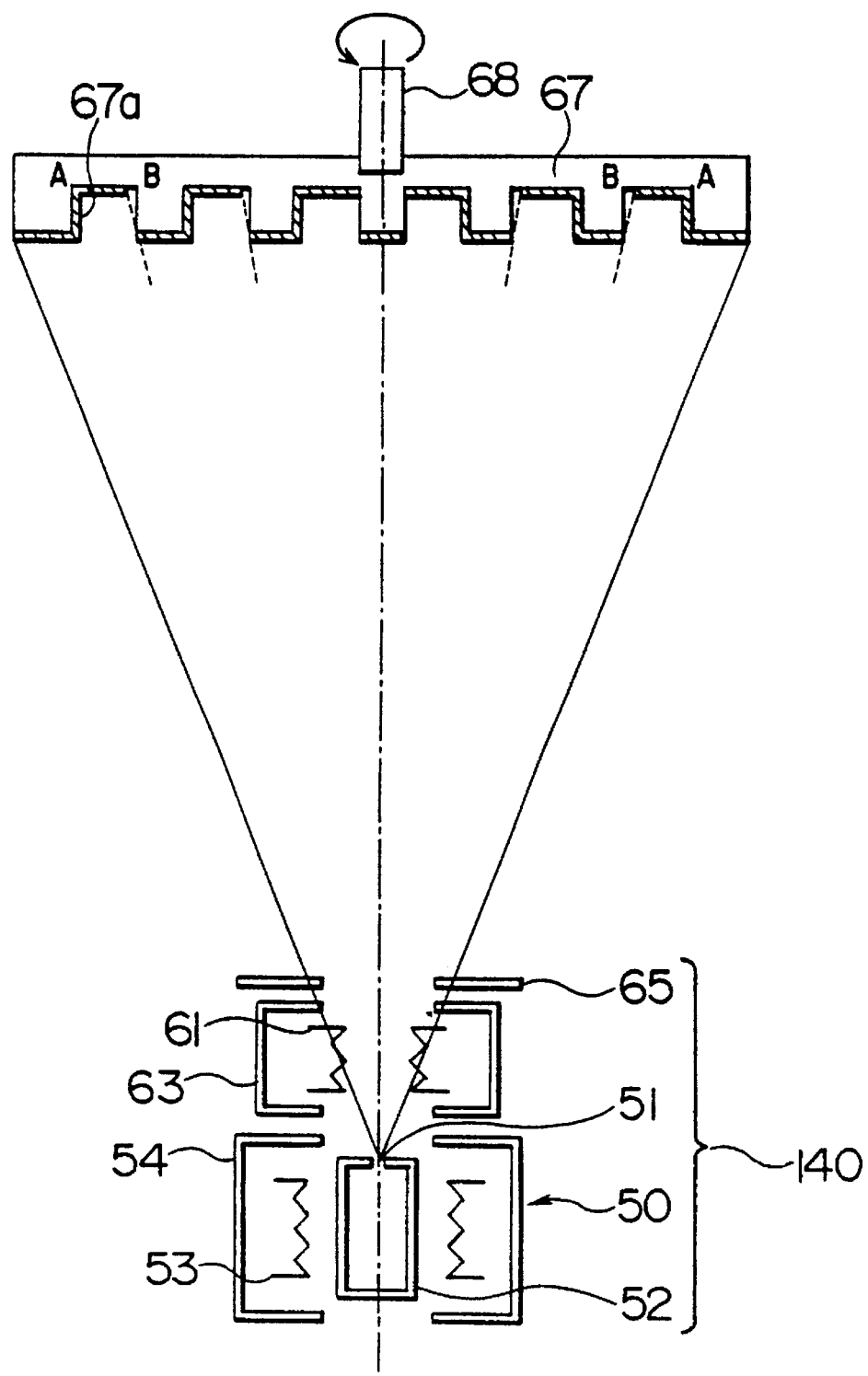
FIG. 32 is an exaggerated view of FIG. 31 and shows major portions of the cluster ion beam vapor deposition apparatus.
Figure 33:
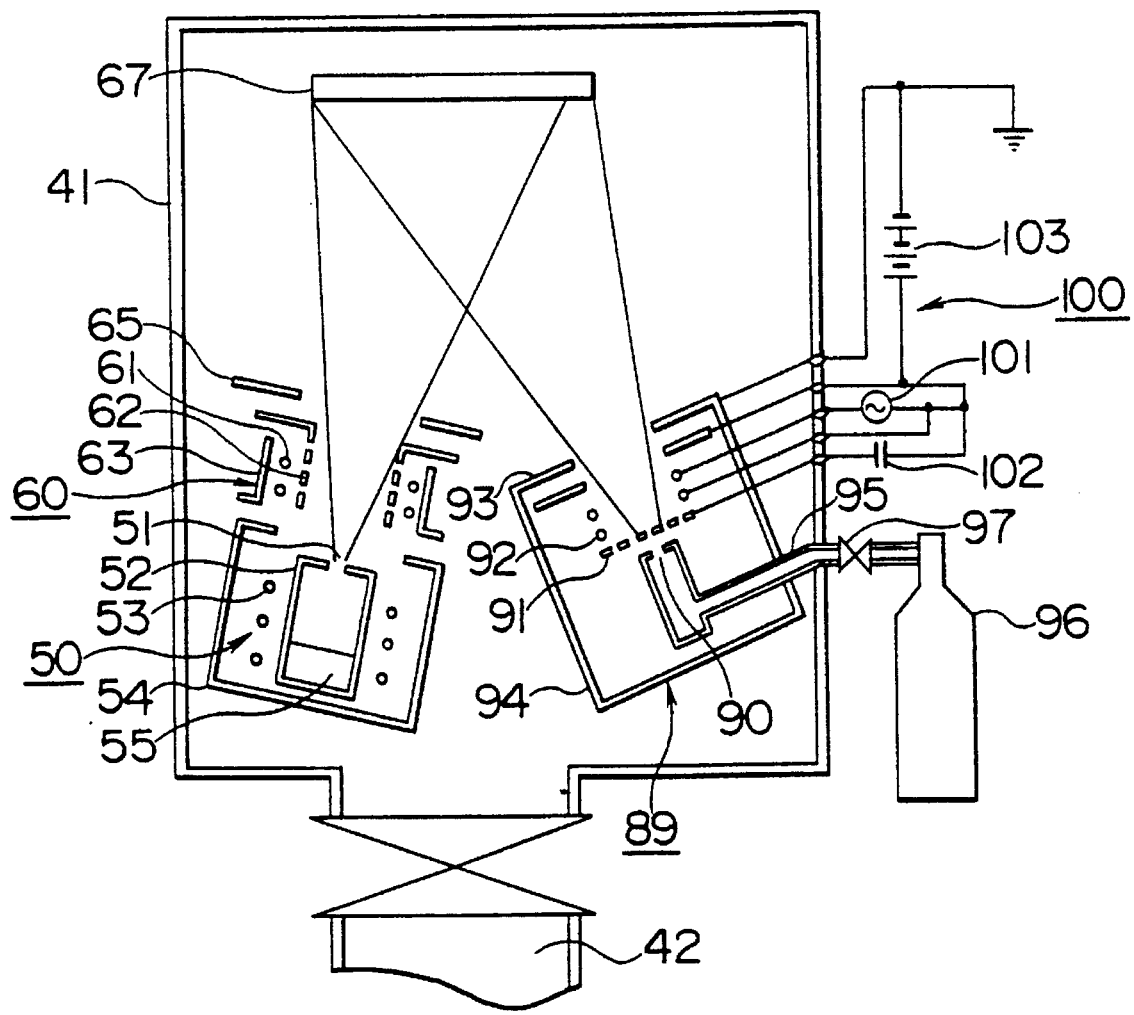
FIG. 33 shows schematically a structure of a thin film forming apparatus also known heretofore.

The cluster ion beam evaporation apparatus according to the instant embodiment of the invention differs from the hitherto known apparatus shown in FIG. 32 and described hereinbefore in that the former is not disposed directly below the substrate 602 in a coaxial alignment but disposed directly below an outer periphery 602 or alternatively at a position obliquely below and outside of the outer periphery. Except this deposition, other structural parts or components are same as or equivalent to that of the apparatus shown in FIG. 32.

Parenthetically, with the phrase "directly below the outer periphery", it is intended to mean that the center axis of the cluster ion beam source (or vertical axis as viewed in FIG. 16) intersects an outermost periphery of an active area of the substrate 602.

In the thin film formation by using the cluster ion beam evaporation point or spot source which is disposed directly below the center of the substrate (i.e., at a coaxial position in which the rotation axis of the substrate extends through the center of the cluster ion beam evaporation spot source), as in the case of the known apparatus shown in FIG. 32, deposition of the clusters at portions B of the contact holes of the substrate 602 and hence the coating susceptibility of these portions B are degraded owing to the self-shadowing effect described hereinbefore.

In contrast, the coating susceptibility of the portions A of the contact holes can be improved when the cluster ion beam evaporation spot source 601 is disposed directly below or outside of the outer periphery 602, as can be seen from FIG. 16.

Accordingly, by rotating the substrate 602 for 180°, the coating susceptibility of the contact hole portions B is increased.

In this manner, by positioning the substrate 602 and the cluster ion beam evaporation spot source 602 in such oblique disposition as shown in FIG. 16 and carrying out the film deposition process by rotating the substrate 602, every inner portion of the contact hole can be coated with a thin film uniformly.

Now, description will be made in detail concerning positional relation between the substrate 602 to be deposited with a film and the cluster ion beam evaporation spot source 601 as well as dimensional relation between the substrate 602 and the contact holes.

Let's represent a radius of the substrate by d, a diameter of the contact hole formed in the substrate 602 by a, a depth thereof by b, a distance between the center axis of rotation of the substrate 602 and the cluster ion beam evaporation spot source 601 by D, and a distance between a plane extending from a surface of the substrate 602 and the cluster ion beam evaporation spot source 601 (more specifically the nozzle 613) by L, respectively.

In the case of the apparatus according to the instant embodiment, the substrate 602 and the cluster ion beam evaporation spot source 601 are sufficiently distance from each other so that the following relations apply valid:

$d=D$, and $L \geq d \ (b/a)$ or $d \leq L \ (a/b)$.

In this case, the position of the cluster ion beam evaporation spot source 601 is required to satisfy the following condition:

$d \leq D \leq L \ (a/b)$.

In other words, for the substrate 602 of a large size, the distance L must be increased correspondingly. On the other hand, when the aspect ratio (i.e., b/a) of the contact hole is of a large value, the distance D can not be selected excessively long.

Referring again to FIG. 16, when the substrate 602 and the cluster ion beam evaporation spot source 601 re disposed excessively closely to each other, i.e., when L<d(b/a) or d>(a/b), a film can not be formed at a center region of the contact hole even though it can be formed on the side wall of the contact hole.

Accordingly, in a preferred mode for carrying out the instant embodiment, a plurality of cluster ion beam evaporation spot sources 601 are disposed not only at the position directly below the outer periphery 602 or outside thereof but at a position lying radially inwardly of the outer periphery of the substrate 602, respectively.

Owing to such disposition, there can be formed uniformly a film all over the inner surfaces of the contact hoe formed in the substrate 602 even in the case where the distance between the substrate 602 and the cluster ion beam evaporation spot source 601 can not be assured.

Figure 17A:
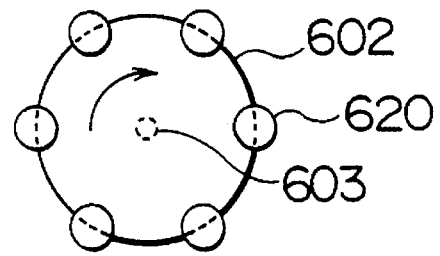
Figure 17B:
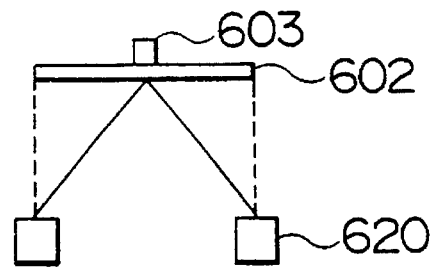

FIGS. 17(a) and 17(b) show in a top plan view and a side elevational view, respectively, an arrangement according to a preferred modification of the instant embodiment shown in FIG. 16, in which six cluster ion beam evaporation spot source are disposed directly below the outer periphery of a substrate to be formed with a thin film through vapor deposition process.

In FIG. 17(a), reference numeral 602 denotes a substrate on which a film is to be formed, 603 denotes a rotating means for rotating the substrate 602, and 620 denote six cluster ion beam evaporation spot sources disposed directly below the outer periphery of the substrate 602.

The six cluster ion beam evaporation spot source 620 includes two sources for evaporating aluminum, two sources for evaporating copper and two sources for evaporating titanium.

With this arrangement, a film of an alloy of aluminum, copper and titanium can uniformly be formed in the contact holes of the substrate 602. Besides, by employing an increased number of the cluster beam evaporation spot sources, evaporation or formation of a film through vapor deposition can be accomplished at a high speed and a more uniform distribution of film thickness can be obtained.

Figure 18A:
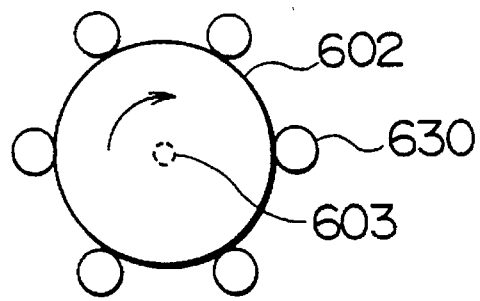
Figure 18B:
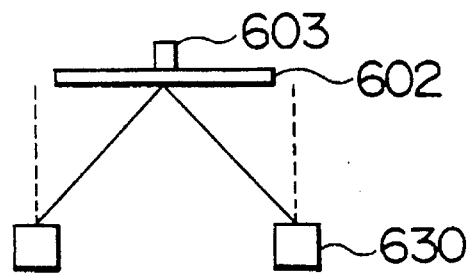

In an arrangement shown in FIGS. 18(a) and 18(b), six cluster ion beam evaporation spot sources 630 are disposed below the substrate 602 at positions outside of the outer periphery thereof.

Figure 19:
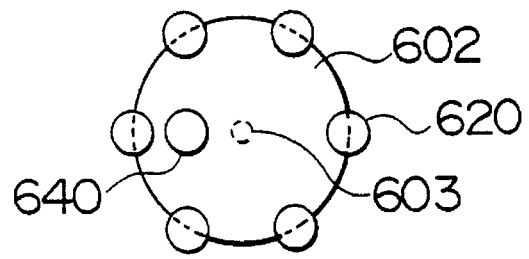
Figure 19:
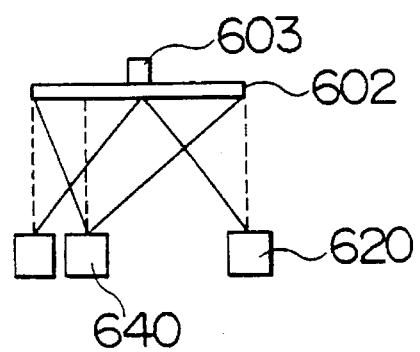

At this juncture, it should be mentioned that in the case where the substrate and the evaporation spot sources are disposed with a shorter distance therebetween, six cluster ion beam evaporation spot sources 620 may be disposed at positions directly below the outer periphery of the substrate with another cluster ion beam evaporation spot source 640 being disposed at a position below the substrate 602 between the center of rotation and the outer periphery thereof, as illustrated in FIGS. 19(a) and 19(b).

Of course, the disposition of the cluster beam evaporation spot sources are never restricted to the arrangements described above. So long as the requirement imposed on the size of the contact hole and the positional relation between the cluster ion beam evaporation spot sources mentioned previously are satisfied, there may be adopted such various combinations of the cluster ion beam evaporation spot sources 620, 630, 640 and 650 as shown in FIGS. 20(a),(b) to FIGS. 26(a),(b).

Figure 20:
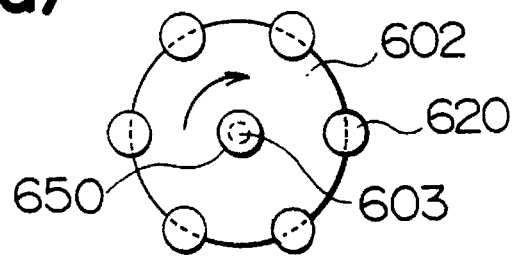
Figure 20:
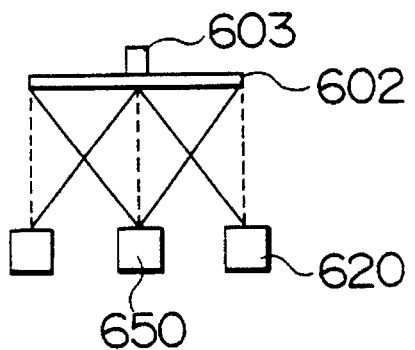

More specifically, FIGS. 20(a) and 20(b) show an arrangement in which a cluster ion beam evaporation spot source 650 is disposed directly below the center of rotation of the substrate 602 in addition to six cluster ion beam evaporation spot sources 620 disposed directly below the outer periphery of the substrate 602.

Figure 21:
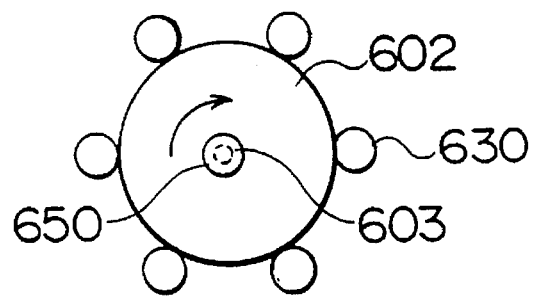
Figure 21:
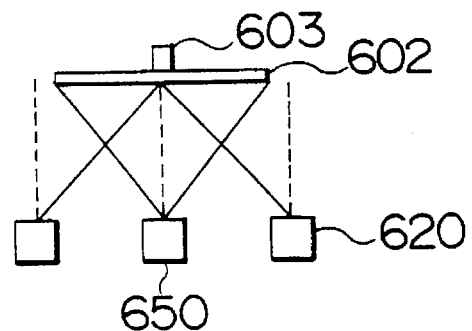

In the arrangement shown in FIGS. 21(a) and 21(b), a cluster ion beam evaporation spot source 650 is disposed directly below the center of rotation of the substrate 602 in addition to six cluster ion beam evaporation spot sources 630 disposed below and outside of the outer periphery of the substrate 602.

Figure 22:
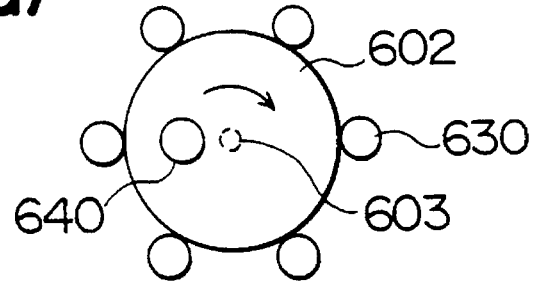
Figure 22:
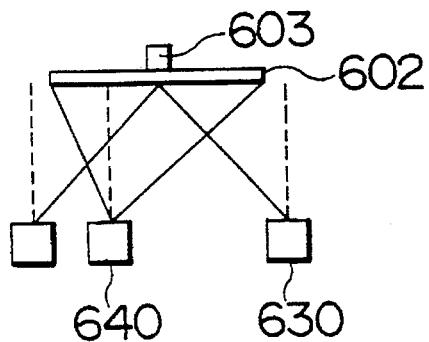

In the arrangement shown in FIGS. 22(a) and 22(b), a cluster ion beam evaporation spot source 640 is disposed below the substrate 602 at a position located between the center axis of rotation of the substrate 602 and the outer periphery thereof in addition to six cluster ion beam evaporation spot sources 640 disposed below and outside of the outer periphery of the substrate 602.

Figure 23A:
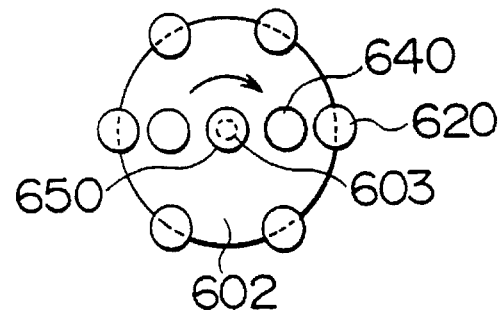
Figure 23B:
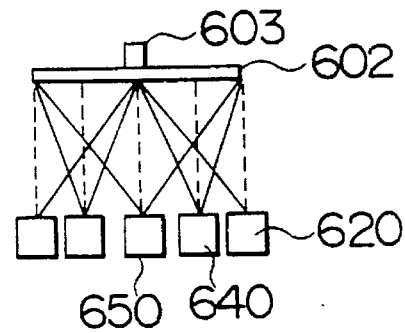

Further, FIGS. 23(a) and 23(b) show a structure in which two cluster ion beam evaporation spot sources 640 and one cluster ion beam evaporation spot source 630 are used in addition to six cluster ion beam evaporation spot source 620 disposed directly below the outer periphery of the substrate 602.

Figure 24A:
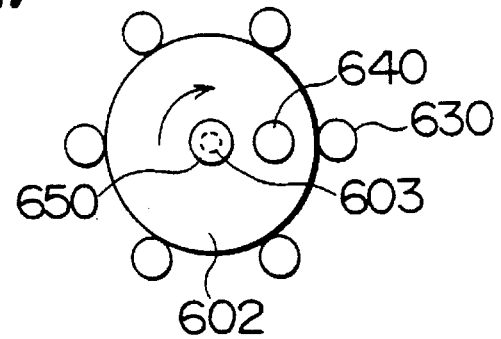
Figure 24B:
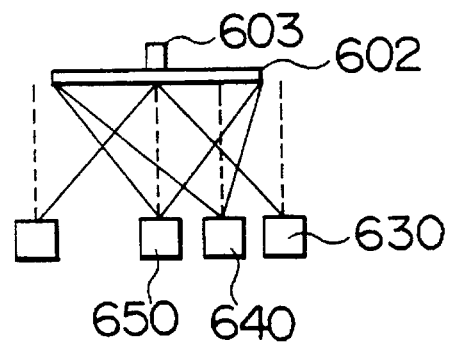

In the structure show in FIGS. 24(a) and 24(b), one cluster ion beam evaporation spot source 650 is disposed directly below the rotational center 603 of the substrate 602 and another one 640 is disposed at a position between the rotational center and the outer periphery of the substrate in addition to six cluster ion beam evaporation spot sources 620 disposed below and outside of the outer periphery of the substrate.

Figure 25A:
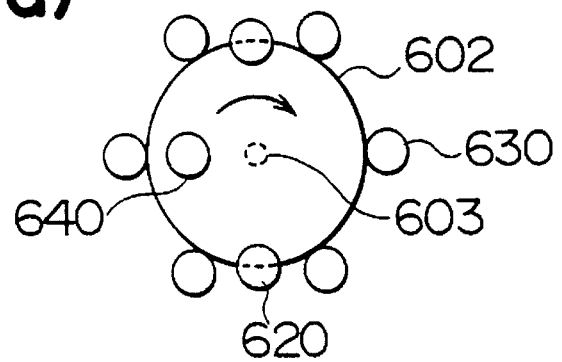
Figure 25B:
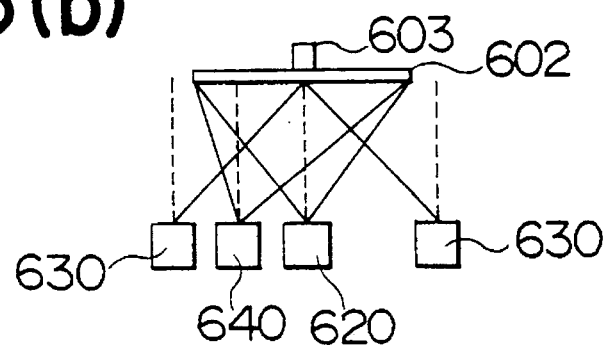

In the structure shown in FIGS. 25(a) and 25(b), one cluster ion beam evaporation spot source 640 is disposed below the substrate 602 at a position between the rotational center and the outer periphery thereof and two sources 620 are disposed at diametrically opposing positions directly below the outer periphery of the substrate, while six cluster ion beam evaporation spot source 630 are disposed below and outside of the outer periphery of the substrate 602.

Figure 26A:
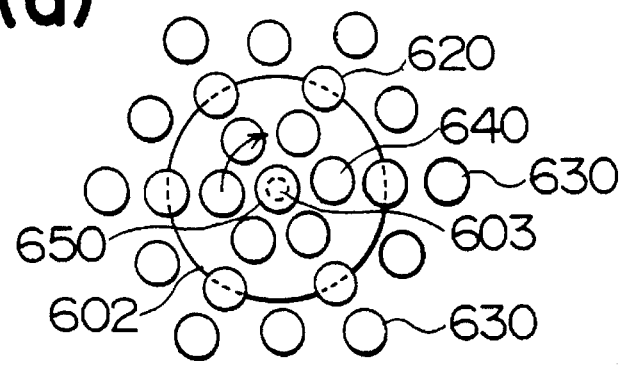
Figure 26B:
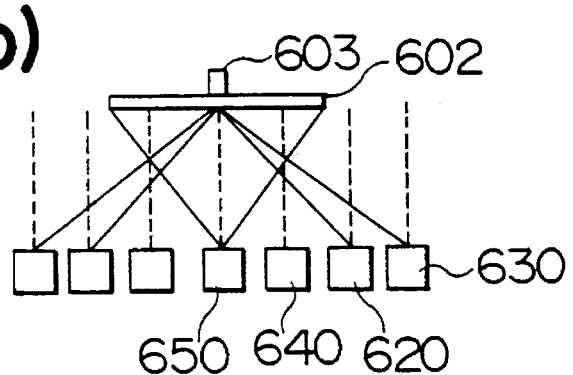
Figure 27:
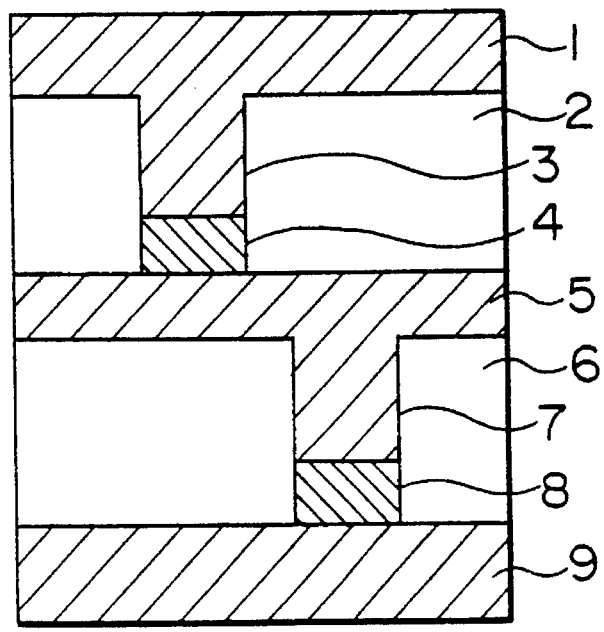
FIG. 27 shows in an enlarged sectional view a structure of an integrated circuit device known heretofore.
Figure 28:
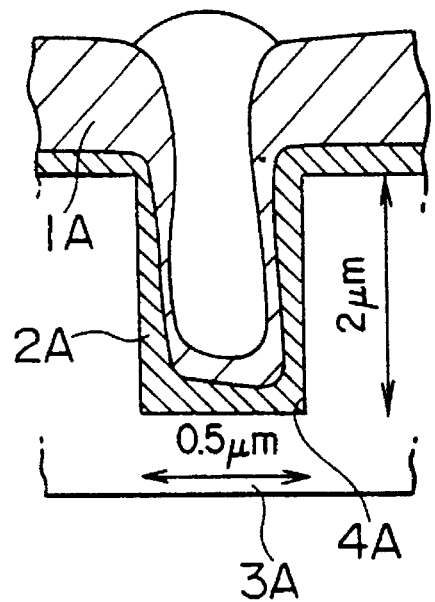
FIG. 28 shows in an enlarged sectional view an integrated circuit structure also known heretofore.
Figure 29:
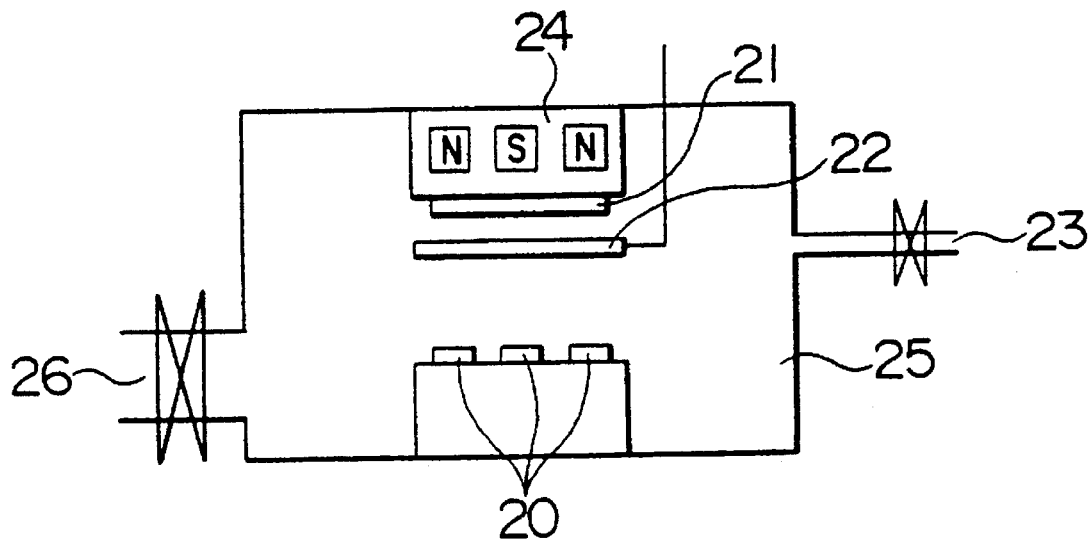
FIG. 29 is a diagram showing schematically a general structure of a magnetron type sputtering apparatus known heretofore.
Figure 30:
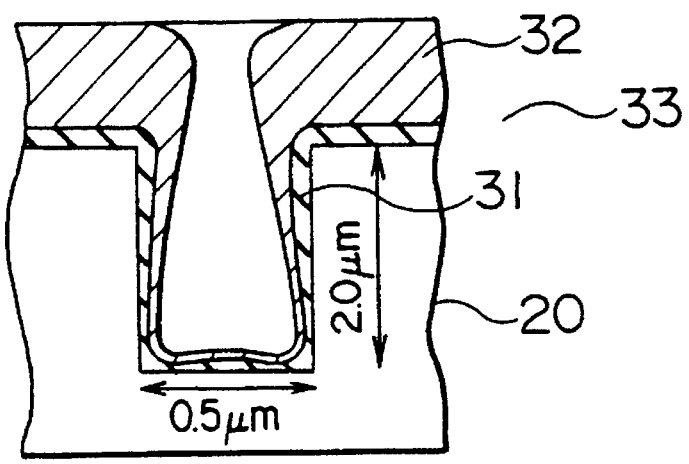
FIG. 30 is a sectional view showing a contact hole having an aspect ratio of about 0.8 in the state deposited with a film by a magnetron type sputtering apparatus.

FIG. 26(a) and 26(b) show schematically yet another structure of the thin film forming apparatus which includes a large number of cluster ion beam evaporation spot sources 630 disposed t locations externally of the outer periphery of the substrate, six cluster ion beam evaporation spot sources 620 disposed directly below the outer periphery of the substrate and six cluster ion beam evaporation spot sources 640 disposed below the substrate 602 between the rotational center and the outer periphery thereof. In this arrangement, the positions of the cluster ion beam evaporation spot sources 630 should be so selected as to satisfy the following condition:

$$D \leq L/\alpha$$

where $\alpha$ represents the aspect ratio of the contact hole formed in the substrate 602, L represents a distance between an extension of the substrate surface and the cluster ion beam evaporation spot source 630, and D represents a distance between the center of rotation of the substrate 602 and the cluster ion beam evaporation spot source 630.

Finally, it should also be mentioned that the material or composition to be deposited on the substrate is never restricted to an alloy of aluminum, copper and titanium but an alloy of aluminum and silicon can equally be used.

Further, although it has been described that the substrate is rotated, the invention is never restricted thereto but the evaporation spot source may be revolved below and around the vertical center axis of the substrate.

As will be apparent from the foregoing, according to the embodiments described above, a thin film can uniformly be formed within the fine contact holes even of a high aspect ratio, whereby the problems which the thin film forming apparatuses known heretofore suffer can satisfactorily be solved according to the teachings of the present invention.

Many features and advantages of the present invention are apparent from the detailed specification and thus it is intended by the appended claims to cover all such features and advantages which fall within the true spirit and scope of the invention. Further, since numerous modifications and changes will readily occur to those skilled in the art, it is not desired to limit the invention to the exact structure construction and operation illustrated and described. Accordingly, all suitable modifications and equivalents may be resorted to within the scope of the invention.

We claim:

1. An integrated circuit device having a substrate, a wiring conductor layer disposed on said substrate, and a barrier layer interposed between said substrate and said wiring conductor layer wherein said barrier layer is titanium nitride containing five atomic percent to twenty atomic percent carbon.

2. The integrated circuit device according to claim 1 including an adhesion layer of titanium and containing oxygen and carbon underlying said barrier layer.

3. An integrated circuit device having a substrate, a wiring conductor layer disposed on said substrate, and a barrier layer interposed between said substrate and said wiring conductor layer wherein said barrier layer is titanium nitride containing oxygen in a concentration of up to twenty atomic percent and carbon in a concentration of up to twenty atomic percent provided total oxygen and carbon content lies within the range of ten atomic percent to twenty atomic percent.

4. The integrated circuit device according to claim 3 including an adhesion layer of titanium and containing one of oxygen and carbon underlying said barrier layer.

5. The integrated circuit device according to claim 4 wherein said adhesion layer contains carbon and oxygen.

6. An integrated circuit comprising a substrate, a wiring conductor layer disposed on said substrate, and an adhesion layer adhered to a layer of another component, wherein said adhesion layer is titanium nitride containing five to twenty atomic percent of carbon.

7. An integrated circuit comprising a substrate, a wiring conductor layer disposed on said substrate, and an adhesion layer adhered to a layer of another component, wherein said adhesion layer is titanium nitride containing oxygen in a concentration of up to twenty atomic percent and carbon in a concentration of up to twenty atomic percent provided total oxygen and carbon content lies within the range of ten atomic percent to twenty atomic percent.

\* \* \* \* \*